United States Patent
Swaminathan et al.

(10) Patent No.: US 9,673,041 B2
(45) Date of Patent: *Jun. 6, 2017

(54) PLASMA ASSISTED ATOMIC LAYER DEPOSITION TITANIUM OXIDE FOR PATTERNING APPLICATIONS

(71) Applicant: Lam Research Corporation, Fremont, CA (US)

(72) Inventors: Shankar Swaminathan, Beaverton, OR (US); Frank L. Pasquale, Beaverton, OR (US); Adrien LaVoie, Newberg, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/178,474

(22) Filed: Jun. 9, 2016

(65) Prior Publication Data

US 2016/0293838 A1    Oct. 6, 2016

Related U.S. Application Data

(60) Continuation of application No. 15/019,904, filed on Feb. 9, 2016, now Pat. No. 9,570,290, which is a
(Continued)

(51) Int. Cl.
*H01L 21/02* (2006.01)
*H01L 43/12* (2006.01)
(Continued)

(52) U.S. Cl.
CPC ...... *H01L 21/02186* (2013.01); *C23C 16/045* (2013.01); *C23C 16/405* (2013.01);
(Continued)

(58) Field of Classification Search
CPC .......... H01L 21/3141; H01L 21/02274; H01L 21/0228; H01L 21/02186; H01L 21/67005
See application file for complete search history.

(56) References Cited

U.S. PATENT DOCUMENTS

| 4,500,563 A | 2/1985 | Ellenberger et al. |
| 5,223,443 A | 6/1993 | Chinn et al. |

(Continued)

FOREIGN PATENT DOCUMENTS

| CN | 1732288 A | 2/2006 |
| CN | 1926668 A | 3/2007 |

(Continued)

OTHER PUBLICATIONS

U.S. Appl. No. 15/015,952, filed Feb. 4, 2016, entitled "Methods for Depositing Films on Sensitive Substrates".

(Continued)

*Primary Examiner* — Joseph C Nicely
(74) *Attorney, Agent, or Firm* — Weaver Austin Villeneuve & Sampson LLP

(57) ABSTRACT

The embodiments herein relate to methods and apparatus for depositing an encapsulation layer over memory stacks in MRAM and PCRAM applications. The encapsulation layer is a titanium dioxide ($TiO_2$) layer deposited through an atomic layer deposition reaction. In some embodiments, the encapsulation layer may be deposited as a bilayer, with an electrically favorable layer formed atop a protective layer. In certain implementations, gaps between neighboring memory stacks may be filled with titanium oxide, for example through an atomic layer deposition reaction or a chemical vapor deposition reaction.

20 Claims, 10 Drawing Sheets

Related U.S. Application Data continuation of application No. 14/187,145, filed on Feb. 21, 2014, now Pat. No. 9,373,500, and a continuation-in-part of application No. 14/607,997, filed on Jan. 28, 2015, now Pat. No. 9,570,274, which is a continuation of application No. 14/133,239, filed on Dec. 18, 2013, now Pat. No. 8,999,859, which is a division of application No. 13/242,084, filed on Sep. 23, 2011, now Pat. No. 8,637,411, which is a continuation-in-part of application No. 13/084,399, filed on Apr. 11, 2011, now Pat. No. 8,728,956, said application No. 15/019,904 is a continuation-in-part of application No. 14/631,637, filed on Feb. 25, 2015, now Pat. No. 9,343,296, which is a continuation of application No. 13/738,851, filed on Jan. 10, 2013, now Pat. No. 8,993,460.

(60) Provisional application No. 61/324,710, filed on Apr. 15, 2010, provisional application No. 61/372,367, filed on Aug. 10, 2010, provisional application No. 61/379,081, filed on Sep. 1, 2010, provisional application No. 61/417,807, filed on Nov. 29, 2010.

(51) Int. Cl.

| | | |
|---|---|---|
| *H01L 43/02* | (2006.01) | |
| *H01L 45/00* | (2006.01) | |
| *H01L 43/08* | (2006.01) | |
| *H01J 37/32* | (2006.01) | |
| *H01L 21/314* | (2006.01) | |
| *H01L 21/67* | (2006.01) | |
| *C23C 16/04* | (2006.01) | |
| *C23C 16/40* | (2006.01) | |
| *C23C 16/455* | (2006.01) | |
| *H01L 27/22* | (2006.01) | |
| *H01L 27/24* | (2006.01) | |

(52) U.S. Cl.
CPC .. *C23C 16/45542* (2013.01); *H01J 37/32082* (2013.01); *H01J 37/32192* (2013.01); *H01J 37/32449* (2013.01); *H01L 21/0228* (2013.01); *H01L 21/02274* (2013.01); *H01L 21/3141* (2013.01); *H01L 21/67005* (2013.01); *H01L 43/02* (2013.01); *H01L 43/08* (2013.01); *H01L 43/12* (2013.01); *H01L 45/06* (2013.01); *H01L 45/12* (2013.01); *H01L 45/141* (2013.01); *H01L 45/16* (2013.01); *H01L 27/222* (2013.01); *H01L 27/2463* (2013.01)

(56) References Cited

U.S. PATENT DOCUMENTS

| | | |
|---|---|---|
| 5,496,608 A | 3/1996 | Matsuda et al. |
| 5,593,914 A | 1/1997 | Evans, Jr. et al. |
| 5,670,432 A | 9/1997 | Tsai |
| 5,856,003 A | 1/1999 | Chiu |
| 5,874,368 A | 2/1999 | Laxman et al. |
| 5,932,286 A | 8/1999 | Beinglass et al. |
| 6,069,058 A | 5/2000 | Hong |
| 6,100,202 A | 8/2000 | Lin et al. |
| 6,218,293 B1 | 4/2001 | Kraus et al. |
| 6,270,572 B1 | 8/2001 | Kim et al. |
| 6,346,741 B1 | 2/2002 | Van Buskirk et al. |
| 6,391,803 B1 | 5/2002 | Kim et al. |
| 6,416,822 B1 | 7/2002 | Chiang et al. |
| 6,428,859 B1 | 8/2002 | Chiang et al. |
| 6,468,924 B2 | 10/2002 | Lee et al. |
| 6,509,601 B1 | 1/2003 | Lee et al. |
| 6,528,430 B2 | 3/2003 | Kwan et al. |
| 6,551,893 B1 | 4/2003 | Zheng et al. |
| 6,569,501 B2 | 5/2003 | Chiang et al. |
| 6,576,053 B1 | 6/2003 | Kim et al. |
| 6,602,784 B2 | 8/2003 | Sneh |
| 6,632,478 B2 | 10/2003 | Gaillard et al. |
| 6,645,574 B1 | 11/2003 | Lee et al. |
| 6,689,220 B1 | 2/2004 | Nguyen |
| 6,723,595 B2 | 4/2004 | Park |
| 6,730,614 B1 | 5/2004 | Lim et al. |
| 6,743,738 B2 | 6/2004 | Todd |
| 6,756,318 B2 | 6/2004 | Nguyen et al. |
| 6,765,303 B1 | 7/2004 | Krivokapic |
| 6,809,421 B1 | 10/2004 | Hayasaka et al. |
| 6,828,218 B2 | 12/2004 | Kim et al. |
| 6,835,417 B2 | 12/2004 | Saenger et al. |
| 6,861,356 B2 | 3/2005 | Matsuse et al. |
| 6,884,466 B2 | 4/2005 | Kaloyeros et al. |
| 6,930,058 B2 | 8/2005 | Hill et al. |
| 6,930,060 B2 | 8/2005 | Chou et al. |
| 6,943,092 B2 | 9/2005 | Kim et al. |
| 6,962,876 B2 | 11/2005 | Ahn et al. |
| 6,987,240 B2 | 1/2006 | Jennings et al. |
| 7,001,844 B2 | 2/2006 | Chakravarti et al. |
| 7,041,335 B2 | 5/2006 | Chung |
| 7,077,904 B2 | 7/2006 | Cho et al. |
| 7,081,271 B2 | 7/2006 | Chung et al. |
| 7,109,129 B1 | 9/2006 | Papasouliotis |
| 7,115,166 B2 | 10/2006 | Vaartstra et al. |
| 7,115,528 B2 | 10/2006 | Vaartstra et al. |
| 7,122,222 B2 | 10/2006 | Xiao et al. |
| 7,122,464 B2 | 10/2006 | Vaarstra |
| 7,125,815 B2 | 10/2006 | Vaarstra |
| 7,132,353 B1 | 11/2006 | Xia et al. |
| 7,141,278 B2 | 11/2006 | Koh et al. |
| 7,148,155 B1 | 12/2006 | Tarafdar et al. |
| 7,151,039 B2 | 12/2006 | Lee et al. |
| 7,172,792 B2 | 2/2007 | Wang et al. |
| 7,176,084 B2 | 2/2007 | Lee et al. |
| 7,205,187 B2 | 4/2007 | Leith et al. |
| 7,223,649 B2 | 5/2007 | Oh et al. |
| 7,235,484 B2 | 6/2007 | Nguyen et al. |
| 7,241,686 B2 | 7/2007 | Marcadal et al. |
| 7,244,668 B2 | 7/2007 | Kim |
| 7,250,083 B2 | 7/2007 | Sneh |
| 7,259,050 B2 | 8/2007 | Chen et al. |
| 7,261,919 B2 | 8/2007 | Mehregany et al. |
| 7,294,582 B2 | 11/2007 | Haverkort et al. |
| 7,297,641 B2 | 11/2007 | Todd et al. |
| 7,300,885 B2 | 11/2007 | Hasebe et al. |
| 7,314,835 B2 | 1/2008 | Ishizaka et al. |
| 7,341,959 B2 | 3/2008 | Brcka |
| 7,351,668 B2 | 4/2008 | Chou et al. |
| 7,361,538 B2 | 4/2008 | Luan et al. |
| 7,361,611 B2 | 4/2008 | Chakravarti et al. |
| 7,390,743 B2 | 6/2008 | Shin |
| 7,393,561 B2 | 7/2008 | Paranjpe |
| 7,399,388 B2 | 7/2008 | Moghadam et al. |
| 7,419,888 B2 | 9/2008 | Yang et al. |
| 7,435,454 B2 | 10/2008 | Brcka |
| 7,435,684 B1 | 10/2008 | Lang et al. |
| 7,462,571 B2 | 12/2008 | Hasebe et al. |
| 7,482,247 B1 | 1/2009 | Papasouliotis et al. |
| 7,488,694 B2 | 2/2009 | Kim et al. |
| 7,507,676 B2 | 3/2009 | Chou et al. |
| 7,510,984 B2 | 3/2009 | Saito et al. |
| 7,521,331 B2 | 4/2009 | Park et al. |
| 7,524,762 B2 | 4/2009 | Marcadal et al. |
| 7,544,615 B2 | 6/2009 | Vaartstra |
| 7,572,052 B2 | 8/2009 | Ravi et al. |
| 7,592,231 B2 | 9/2009 | Cheng et al. |
| 7,595,010 B2 | 9/2009 | Chakravarti et al. |
| 7,601,648 B2 | 10/2009 | Chua et al. |
| 7,615,438 B2 | 11/2009 | Ahn et al. |
| 7,615,449 B2 | 11/2009 | Chung et al. |
| 7,622,369 B1 | 11/2009 | Lee et al. |
| 7,622,383 B2 | 11/2009 | Kim et al. |
| 7,629,267 B2 | 12/2009 | Wan et al. |
| 7,632,757 B2 | 12/2009 | Matsuura |
| 7,633,125 B2 | 12/2009 | Lu et al. |
| 7,638,170 B2 | 12/2009 | Li |

(56) References Cited

U.S. PATENT DOCUMENTS

| | | |
|---|---|---|
| 7,645,484 B2 | 1/2010 | Ishizaka |
| 7,651,729 B2 | 1/2010 | Kim et al. |
| 7,651,730 B2 | 1/2010 | Hasebe |
| 7,651,953 B2 | 1/2010 | Todd et al. |
| 7,651,959 B2 | 1/2010 | Fukazawa et al. |
| 7,682,657 B2 | 3/2010 | Sherman |
| 7,687,409 B2 | 3/2010 | Ahn et al. |
| 7,713,592 B2 | 5/2010 | Nguyen et al. |
| 7,758,920 B2 | 7/2010 | Hasebe et al. |
| 7,776,733 B2 | 8/2010 | Hasegawa |
| 7,790,633 B1 | 9/2010 | Tarafdar et al. |
| 7,825,039 B2 | 11/2010 | Takahashi et al. |
| 7,906,168 B2 | 3/2011 | Hasebe et al. |
| 7,919,416 B2 | 4/2011 | Lee et al. |
| 7,923,068 B2 | 4/2011 | Dickey et al. |
| 7,923,378 B2 | 4/2011 | Hasebe et al. |
| 7,959,985 B2 | 6/2011 | Ishizaka et al. |
| 7,964,241 B2 | 6/2011 | Hasebe et al. |
| 7,964,513 B2 | 6/2011 | Todd et al. |
| 7,972,980 B2 | 7/2011 | Lee et al. |
| 7,981,473 B2 | 7/2011 | Kim et al. |
| 7,989,365 B2 | 8/2011 | Park et al. |
| 8,034,673 B2 | 10/2011 | Kadonaga et al. |
| 8,080,290 B2 | 12/2011 | Hasebe et al. |
| 8,101,531 B1 | 1/2012 | Li et al. |
| 8,119,424 B2 | 2/2012 | Mather et al. |
| 8,119,544 B2 | 2/2012 | Hasebe et al. |
| 8,133,797 B2 | 3/2012 | van Schravendijk et al. |
| 8,178,448 B2 | 5/2012 | Nodera et al. |
| 8,227,032 B2 | 7/2012 | Dussarrat et al. |
| 8,257,789 B2 | 9/2012 | Matsunaga et al. |
| 8,278,224 B1 | 10/2012 | Mui et al. |
| 8,334,218 B2 | 12/2012 | Van Nooten et al. |
| 8,357,619 B2 | 1/2013 | Hasebe et al. |
| 8,366,953 B2 | 2/2013 | Kohno et al. |
| 8,383,525 B2 | 2/2013 | Raisanen et al. |
| 8,394,466 B2 | 3/2013 | Hong et al. |
| 8,524,612 B2 | 9/2013 | Li et al. |
| 8,592,328 B2 | 11/2013 | Hausmann et al. |
| 8,633,050 B2 | 1/2014 | Pierreux |
| 8,637,411 B2 | 1/2014 | Swaminathan et al. |
| 8,647,993 B2 | 2/2014 | Lavoie et al. |
| 8,669,185 B2 | 3/2014 | Onizawa et al. |
| 8,728,955 B2 | 5/2014 | LaVoie et al. |
| 8,728,956 B2 | 5/2014 | LaVoie et al. |
| 8,956,983 B2 | 2/2015 | Swaminathan et al. |
| 8,999,859 B2 | 4/2015 | Swaminathan et al. |
| 9,076,646 B2 | 7/2015 | Sims et al. |
| 9,214,334 B2 | 12/2015 | Swaminathan et al. |
| 9,230,800 B2 | 1/2016 | Lavoie et al. |
| 9,257,274 B2 | 2/2016 | Kang et al. |
| 9,287,113 B2 | 3/2016 | Kang et al. |
| 9,355,839 B2 | 5/2016 | Swaminathan et al. |
| 9,355,886 B2 | 5/2016 | Swaminathan et al. |
| 9,373,500 B2 | 6/2016 | Swaminathan et al. |
| 9,502,238 B2 | 11/2016 | Danek et al. |
| 9,564,312 B2 | 2/2017 | Henri et al. |
| 9,570,274 B2 | 2/2017 | Swaminathan et al. |
| 9,570,290 B2 | 2/2017 | Swaminathan et al. |
| 9,611,544 B2 | 4/2017 | Lavoie et al. |
| 2002/0076507 A1 | 6/2002 | Chiang et al. |
| 2003/0008070 A1 | 1/2003 | Seutter et al. |
| 2003/0024477 A1 | 2/2003 | Okuda et al. |
| 2003/0143839 A1 | 7/2003 | Raaijmakers et al. |
| 2003/0200917 A1 | 10/2003 | Vaartstra |
| 2004/0033698 A1 | 2/2004 | Lee et al. |
| 2004/0043633 A1 | 3/2004 | Vaartstra |
| 2004/0053515 A1 | 3/2004 | Comita et al. |
| 2004/0121164 A1 | 6/2004 | Iacovangelo et al. |
| 2004/0129212 A1 | 7/2004 | Gadgil et al. |
| 2004/0219746 A1 | 11/2004 | Vaartstra et al. |
| 2004/0231799 A1 | 11/2004 | Lee et al. |
| 2005/0005851 A1 | 1/2005 | Keshner et al. |
| 2005/0042865 A1 | 2/2005 | Cabral et al. |
| 2005/0079661 A1 | 4/2005 | Cho et al. |
| 2005/0109276 A1 | 5/2005 | Iyer et al. |
| 2005/0118837 A1 | 6/2005 | Todd et al. |
| 2005/0158983 A1 | 7/2005 | Hoshi et al. |
| 2005/0159017 A1 | 7/2005 | Kim et al. |
| 2005/0181535 A1 | 8/2005 | Yun et al. |
| 2005/0184397 A1 | 8/2005 | Gates et al. |
| 2005/0196977 A1 | 9/2005 | Saito et al. |
| 2005/0208718 A1 | 9/2005 | Lim et al. |
| 2005/0230047 A1 | 10/2005 | Collins et al. |
| 2005/0233553 A1 | 10/2005 | Kountz et al. |
| 2005/0260347 A1 | 11/2005 | Narwankar et al. |
| 2005/0276099 A1 | 12/2005 | Horng et al. |
| 2005/0287775 A1 | 12/2005 | Hasebe et al. |
| 2006/0009041 A1 | 1/2006 | Iyer et al. |
| 2006/0030148 A1 | 2/2006 | Seutter et al. |
| 2006/0084283 A1 | 4/2006 | Paranjpe et al. |
| 2006/0088985 A1 | 4/2006 | Haverkort et al. |
| 2006/0165890 A1 | 7/2006 | Kaushal et al. |
| 2006/0199357 A1 | 9/2006 | Wan et al. |
| 2006/0228868 A1 | 10/2006 | Ahn et al. |
| 2006/0286774 A1 | 12/2006 | Singh et al. |
| 2006/0286776 A1 | 12/2006 | Ranish et al. |
| 2006/0286818 A1 | 12/2006 | Wang et al. |
| 2007/0010071 A1 | 1/2007 | Matsuura |
| 2007/0026540 A1 | 2/2007 | Nooten et al. |
| 2007/0065576 A1 | 3/2007 | Singh et al. |
| 2007/0087574 A1 | 4/2007 | Gupta et al. |
| 2007/0087581 A1 | 4/2007 | Singh et al. |
| 2007/0116887 A1 | 5/2007 | Faguet |
| 2007/0134942 A1 | 6/2007 | Ahn et al. |
| 2007/0137572 A1 | 6/2007 | Matsuura et al. |
| 2007/0145483 A1 | 6/2007 | Ono |
| 2007/0167028 A1 | 7/2007 | Chou et al. |
| 2007/0215036 A1 | 9/2007 | Park et al. |
| 2007/0218701 A1 | 9/2007 | Shimizu et al. |
| 2007/0231487 A1 | 10/2007 | Ishizaka |
| 2007/0232082 A1 | 10/2007 | Balseanu et al. |
| 2007/0251444 A1 | 11/2007 | Gros-Jean et al. |
| 2007/0259110 A1 | 11/2007 | Mahajani et al. |
| 2008/0014759 A1 | 1/2008 | Chua et al. |
| 2008/0038936 A1 | 2/2008 | Todd et al. |
| 2008/0063791 A1 | 3/2008 | Hasebe et al. |
| 2008/0075881 A1 | 3/2008 | Won et al. |
| 2008/0081470 A1 | 4/2008 | Clark |
| 2008/0087890 A1 | 4/2008 | Ahn et al. |
| 2008/0123394 A1 | 5/2008 | Lee et al. |
| 2008/0131601 A1 | 6/2008 | Kim et al. |
| 2008/0138996 A1 | 6/2008 | Nishizuka |
| 2008/0139003 A1 | 6/2008 | Pirzada et al. |
| 2008/0207007 A1 | 8/2008 | Thridandam et al. |
| 2008/0213479 A1 | 9/2008 | Chou et al. |
| 2008/0242116 A1 | 10/2008 | Clark |
| 2008/0260969 A1 | 10/2008 | Dussarrat et al. |
| 2008/0274302 A1 | 11/2008 | Hasebe et al. |
| 2008/0311760 A1 | 12/2008 | Nodera et al. |
| 2008/0317972 A1 | 12/2008 | Hendriks et al. |
| 2009/0018668 A1 | 1/2009 | Galbraith |
| 2009/0039349 A1 | 2/2009 | Honda |
| 2009/0041952 A1 | 2/2009 | Yoon et al. |
| 2009/0065896 A1 | 3/2009 | Hwang et al. |
| 2009/0075490 A1 | 3/2009 | Dussarrat |
| 2009/0148625 A1 | 6/2009 | Yeom et al. |
| 2009/0155606 A1 | 6/2009 | Yoon et al. |
| 2009/0163012 A1 | 6/2009 | Clark et al. |
| 2009/0191722 A1 | 7/2009 | Hasebe et al. |
| 2009/0203197 A1 | 8/2009 | Hanawa et al. |
| 2009/0208880 A1 | 8/2009 | Nemani et al. |
| 2009/0278224 A1 | 11/2009 | Kim et al. |
| 2010/0022099 A1 | 1/2010 | Van Nooten et al. |
| 2010/0025824 A1 | 2/2010 | Chen et al. |
| 2010/0051578 A1 | 3/2010 | Chang et al. |
| 2010/0096688 A1 | 4/2010 | Balseanu et al. |
| 2010/0099236 A1 | 4/2010 | Kwon et al. |
| 2010/0099271 A1 | 4/2010 | Hausmann et al. |
| 2010/0102417 A1 | 4/2010 | Ganguli et al. |
| 2010/0120262 A1 | 5/2010 | Vorsa et al. |
| 2010/0124618 A1 | 5/2010 | Kobayashi et al. |
| 2010/0124621 A1 | 5/2010 | Kobayashi et al. |
| 2010/0136260 A1 | 6/2010 | Matsunaga et al. |

(56) References Cited

U.S. PATENT DOCUMENTS

| | | |
|---|---|---|
| 2010/0136313 A1 | 6/2010 | Shimizu et al. |
| 2010/0167555 A1 | 7/2010 | Maula et al. |
| 2010/0221925 A1 | 9/2010 | Lee et al. |
| 2010/0255218 A1 | 10/2010 | Oka et al. |
| 2010/0304574 A1 | 12/2010 | Nodera et al. |
| 2010/0310791 A1 | 12/2010 | Shimazu et al. |
| 2011/0003445 A1 | 1/2011 | Murata et al. |
| 2011/0014795 A1 | 1/2011 | Lee et al. |
| 2011/0014796 A1 | 1/2011 | Hayashi |
| 2011/0014798 A1 | 1/2011 | Mallick et al. |
| 2011/0042744 A1 | 2/2011 | Cheng et al. |
| 2011/0064969 A1 | 3/2011 | Chen et al. |
| 2011/0086516 A1 | 4/2011 | Lee et al. |
| 2011/0124187 A1 | 5/2011 | Afzali-Ardakani et al. |
| 2011/0139176 A1 | 6/2011 | Cheung et al. |
| 2011/0143548 A1 | 6/2011 | Cheung et al. |
| 2011/0151142 A1 | 6/2011 | Seamons et al. |
| 2011/0151246 A1 | 6/2011 | Ramon Moreno et al. |
| 2011/0151674 A1 | 6/2011 | Tang et al. |
| 2011/0151678 A1 | 6/2011 | Ashtiani et al. |
| 2011/0159202 A1 | 6/2011 | Matsushita et al. |
| 2011/0176967 A1 | 7/2011 | Okuda et al. |
| 2011/0198756 A1 | 8/2011 | Thenappan et al. |
| 2011/0201210 A1 | 8/2011 | Sato et al. |
| 2011/0215445 A1 | 9/2011 | Yang et al. |
| 2011/0256726 A1 | 10/2011 | LaVoie et al. |
| 2011/0256734 A1 | 10/2011 | Hausmann et al. |
| 2011/0298099 A1 | 12/2011 | Lee et al. |
| 2011/0309475 A1 | 12/2011 | Lee |
| 2012/0009802 A1 | 1/2012 | LaVoie et al. |
| 2012/0009803 A1 | 1/2012 | Jung et al. |
| 2012/0021252 A1 | 1/2012 | Lee |
| 2012/0028454 A1 | 2/2012 | Swaminathan et al. |
| 2012/0028469 A1 | 2/2012 | Onizawa et al. |
| 2012/0058282 A1 | 3/2012 | Hong et al. |
| 2012/0077349 A1 | 3/2012 | Li et al. |
| 2012/0108079 A1 | 5/2012 | Mahajani |
| 2012/0113672 A1 | 5/2012 | Dubrow et al. |
| 2012/0164846 A1 | 6/2012 | Ha et al. |
| 2012/0193693 A1 | 8/2012 | Kanaya |
| 2012/0213940 A1 | 8/2012 | Mallick |
| 2012/0280200 A1 | 11/2012 | Tada et al. |
| 2012/0282418 A1 | 11/2012 | Chou et al. |
| 2012/0315394 A1 | 12/2012 | Ito |
| 2013/0040447 A1 | 2/2013 | Swaminathan et al. |
| 2013/0058161 A1 | 3/2013 | Yamanaka et al. |
| 2013/0058162 A1 | 3/2013 | Yamanaka et al. |
| 2013/0071580 A1 | 3/2013 | Weidman et al. |
| 2013/0115783 A1 | 5/2013 | Kim et al. |
| 2013/0189854 A1 | 7/2013 | Hausmann et al. |
| 2013/0196516 A1 | 8/2013 | Lavoie et al. |
| 2013/0252437 A1 | 9/2013 | Sano et al. |
| 2013/0309415 A1 | 11/2013 | Swaminathan et al. |
| 2013/0319329 A1 | 12/2013 | Li et al. |
| 2013/0344248 A1 | 12/2013 | Clark |
| 2014/0030444 A1 | 1/2014 | Swaminathan et al. |
| 2014/0051262 A9 | 2/2014 | Lavoie et al. |
| 2014/0106574 A1 | 4/2014 | Kang et al. |
| 2014/0113457 A1 | 4/2014 | Sims et al. |
| 2014/0120270 A1 | 5/2014 | Tour et al. |
| 2014/0120737 A1 | 5/2014 | Swaminathan et al. |
| 2014/0134827 A1 | 5/2014 | Swaminathan et al. |
| 2014/0141542 A1 | 5/2014 | Kang et al. |
| 2014/0141626 A1 | 5/2014 | Hausmann et al. |
| 2014/0182619 A1 | 7/2014 | Goto et al. |
| 2014/0209562 A1 | 7/2014 | LaVoie et al. |
| 2014/0216337 A1 | 8/2014 | Swaminathan et al. |
| 2014/0264555 A1 | 9/2014 | Ahn et al. |
| 2014/0273428 A1 | 9/2014 | Shero et al. |
| 2014/0295084 A1 | 10/2014 | Shirai et al. |
| 2014/0302686 A1 | 10/2014 | Pan et al. |
| 2015/0109814 A1 | 4/2015 | Chen et al. |
| 2015/0126042 A1 | 5/2015 | Pasquale et al. |
| 2015/0147483 A1 | 5/2015 | Fukazawa |
| 2015/0159271 A1 | 6/2015 | Lee et al. |
| 2015/0170900 A1 | 6/2015 | LaVoie |
| 2015/0206719 A1 | 7/2015 | Swaminathan et al. |
| 2015/0235835 A1 | 8/2015 | Swaminathan et al. |
| 2015/0243883 A1 | 8/2015 | Swaminathan et al. |
| 2015/0249013 A1 | 9/2015 | Arghavani et al. |
| 2016/0020092 A1 | 1/2016 | Kang et al. |
| 2016/0064211 A1 | 3/2016 | Swaminathan et al. |
| 2016/0118246 A1 | 4/2016 | Kang et al. |
| 2016/0148800 A1 | 5/2016 | Henri et al. |
| 2016/0148806 A1 | 5/2016 | Henri et al. |
| 2016/0155676 A1 | 6/2016 | Kang et al. |
| 2016/0163539 A9 | 6/2016 | Kang et al. |
| 2016/0163972 A1 | 6/2016 | Swaminathan et al. |
| 2016/0293398 A1 | 10/2016 | Danek et al. |
| 2016/0336178 A1* | 11/2016 | Swaminathan ..... H01L 21/0337 |
| 2016/0379826 A9 | 12/2016 | Arghavani et al. |

FOREIGN PATENT DOCUMENTS

| | | |
|---|---|---|
| CN | 101255548 A | 9/2008 |
| CN | 101378007 A | 3/2009 |
| CN | 101416293 A | 4/2009 |
| CN | 101535524 A | 9/2009 |
| CN | 101889331 A | 11/2010 |
| CN | 102906304 A | 1/2013 |
| CN | 103137864 A | 6/2013 |
| EP | 0 277 766 | 8/1988 |
| EP | 0 541 212 | 5/1993 |
| EP | 1 703 552 A2 | 9/2006 |
| EP | 2 278 046 | 1/2011 |
| JP | S48-043472 A | 6/1973 |
| JP | H02-093071 A | 4/1990 |
| JP | H06-177120 A | 6/1994 |
| JP | 10-98032 | 4/1998 |
| JP | H11-172439 | 6/1999 |
| JP | 2001-274404 | 10/2001 |
| JP | 2001-338922 A | 12/2001 |
| JP | 2002-9072 | 1/2002 |
| JP | 2002-134497 A | 5/2002 |
| JP | 2002-164345 A | 6/2002 |
| JP | 2005-210076 A | 8/2005 |
| JP | 2005-310927 | 11/2005 |
| JP | 2006-060091 | 3/2006 |
| JP | 2007-180362 A | 7/2007 |
| JP | 2007-287889 A | 11/2007 |
| JP | 2007-287890 A | 11/2007 |
| JP | 2008-500742 A | 1/2008 |
| JP | 2008-506262 A | 2/2008 |
| JP | 2008-109093 A | 5/2008 |
| JP | 2008-517479 | 5/2008 |
| JP | 2008-258591 A | 10/2008 |
| JP | 2009-540128 A | 11/2009 |
| JP | 4364320 B2 | 11/2009 |
| JP | 2010-10497 | 1/2010 |
| JP | 2010-043081 A | 2/2010 |
| JP | 2010-103484 A | 5/2010 |
| JP | 2010-118664 A | 5/2010 |
| JP | 2010-245518 A | 10/2010 |
| JP | 2010-283388 A | 12/2010 |
| JP | 2011-023576 A | 2/2011 |
| JP | 2013166965 A | 8/2013 |
| JP | 2013225655 A | 10/2013 |
| JP | 2014-532304 A | 12/2014 |
| KR | 10-2001-0111448 | 12/2001 |
| KR | 10-0356473 B1 | 10/2002 |
| KR | 10-2004-0001036 | 1/2004 |
| KR | 10-0734748 B | 7/2007 |
| KR | 10-2009-0057665 | 6/2009 |
| KR | 10-2009-0080019 | 7/2009 |
| KR | 10-2009-0081396 | 7/2009 |
| KR | 10-20130056608 A | 5/2013 |
| TW | 200701341 | 1/2007 |
| TW | 201009942 A | 3/2010 |
| TW | 201042706 A1 | 12/2010 |
| TW | 201144475 A1 | 12/2011 |
| WO | WO 2004/032196 | 4/2004 |
| WO | WO 2006/014471 | 2/2006 |
| WO | WO 2006/018441 | 2/2006 |
| WO | WO 2006/026350 | 3/2006 |

(56) References Cited

FOREIGN PATENT DOCUMENTS

| | | |
|---|---|---|
| WO | WO 2006/104741 | 10/2006 |
| WO | WO 2007/043709 | 4/2007 |
| WO | WO 2007/118026 | 10/2007 |
| WO | WO 2011/130326 | 10/2011 |
| WO | WO 2011/130397 | 10/2011 |
| WO | WO 2012/040317 | 3/2012 |
| WO | WO 2012/048094 | 4/2012 |
| WO | WO 2012/087737 | 6/2012 |
| WO | WO 2013/032786 | 3/2013 |
| WO | WO 2013/043330 | 3/2013 |
| WO | WO 2013/065806 | 5/2013 |
| WO | WO 2013/112727 | 8/2013 |

OTHER PUBLICATIONS

U.S. Appl. No. 15/019,904, filed Feb. 9, 2016, entitled "Plasma Assisted Atomic Layer Deposition Titanium Oxide for Conformal Encapsulation and Gap Fill Applications."

U.S. Appl. No. 14/552,011, filed Nov. 24, 2014, entitled "Selective Inhibition in Atomic Layer Deposition of Silicon-Containing Films."

U.S. Appl. No. 14/678,736, filed Apr. 3, 2015, entitled "Deposition of Conformal Films by Atomic Layer Deposition and Atomic Layer Etch."

US Office Action dated Mar. 15, 2013 issued in U.S. Appl. No. 13/084,399.

US Final Office Action dated Sep. 13, 2013 issued in U.S. Appl. No. 13/084,399.

US Notice of Allowance dated Jan. 15, 2014 issued in U.S. Appl. No. 13/084,399.

US Office Action dated Jan. 2, 2015 issued in U.S. Appl. No. 14/231,554.

US Final Office Action dated Jun. 10, 2015 issued in U.S. Appl. No. 14/231,554.

US Notice of Allowance dated Aug. 31, 2015 issued in U.S. Appl. No. 14/231,554.

US Office Action dated Sep. 14, 2012 issued in U.S. Appl. No. 13/084,305.

US Final Office Action dated Apr. 25, 2013 issued in U.S. Appl. No. 13/084,305.

US Office Action dated Apr. 13, 2011 issued in U.S. Appl. No. 12/889,132.

US Notice of Allowance dated Sep. 30, 2011 issued in U.S. Appl. No. 12/889,132.

US Office Action dated Aug. 1, 2012 issued in U.S. Appl. No. 13/011,569.

US Final Office Action dated Feb. 26, 2013 issued in U.S. Appl. No. 13/011,569.

US Notice of Allowance dated May 6, 2013 issued in U.S. Appl. No. 13/011,569.

US Office Action dated Apr. 4, 2013 issued U.S. Appl. No. 13/242,084.

US Notice of Allowance dated Jun. 19, 2013 issued U.S. Appl. No. 13/242,084.

US Notice of Allowance dated Sep. 19, 2013 issued U.S. Appl. No. 13/242,084.

US Office Action dated Sep. 21, 2015 issued U.S. Appl. No. 14/607,997.

US Final Office Action dated Mar. 18, 2016 issued U.S. Appl. No. 14/607,997.

US Notice of Allowance dated Aug. 7, 2014 issued U.S. Appl. No. 14/133,239.

US Notice of Allowance dated Nov. 26, 2014 issued U.S. Appl. No. 14/133,239.

US Office Action dated Apr. 29, 2013 issued U.S. Appl. No. 13/224,240.

US Final Office Action dated Nov. 22, 2013 issued U.S. Appl. No. 13/224,240.

US Examiner's Answer to Appeal Brief (filed May 22, 2014) Before the Patent Trial and Appeal Board dated Aug. 14, 2014 issued U.S. Appl. No. 13/224,240.

US Office Action dated Jun. 7, 2013 issued U.S. Appl. No. 13/414,619.

US Notice of Allowance dated Jul. 26, 2013, issued U.S. Appl. No. 13/414,619.

US Office Action dated May 24, 2013 issued U.S. Appl. No. 13/472,282.

US Notice of Allowance dated Oct. 4, 2013 issued U.S. Appl. No. 13/472,282.

US Office Action dated May 21, 2014 issued in U.S. Appl. No. 13/607,386.

US Notice of Allowance dated Oct. 8, 2014 issued in U.S. Appl. No. 13/607,386.

US Notice of Allowance dated Nov. 19, 2014 issued in U.S. Appl. No. 13/607,386.

US Office Action dated Jun. 13, 2014 issued in U.S. Appl. No. 13/953,616.

US Final Office Action dated Nov. 24, 2014 issued in U.S. Appl. No. 13/953,616.

US Office Action dated Dec. 11, 2014 issued in U.S. Appl. No. 14/074,596.

US Office Action dated Dec. 24, 2015 issued in U.S. Appl. No. 14/074,596.

US Notice of Allowance dated Feb. 12, 2016 issued in U.S. Appl. No. 14/074,596.

US Office Action dated May 15, 2015 issued in U.S. Appl. No. 14/074,617.

US Notice of Allowance dated Nov. 20, 2015 issued in U.S. Appl. No. 14/074,617.

US Office Action dated Aug. 14, 2015 issued in U.S. Appl. No. 14/061,587.

US Notice of Allowance dated Feb. 11, 2016 issued in U.S. Appl. No. 14/061,587.

US Notice of Allowance [Supplemental Notice of Allowability] dated Mar. 1, 2016 issued in U.S. Appl. No. 14/061,587.

US Office Action dated Mar. 2, 2015 issued in U.S. Appl. No. 14/137,860.

US Notice of Allowance dated Oct. 1, 2015 issued in U.S. Appl. No. 14/137,860.

US Notice of Allowance [Supplemental Notice of Allowability] dated Oct. 22, 2015 issued in U.S. Appl. No. 14/137,860.

US Office Action dated Jul. 10, 2014 issued in U.S. Appl. No. 14/144,107.

US Final Office Action dated Jan. 15, 2015 issued in U.S. Appl. No. 14/144,107.

US Notice of Allowance dated Mar. 19, 2015 issued in U.S. Appl. No. 14/144,107.

US Office Action dated Oct. 21, 2015 issued in U.S. Appl. No. 14/194,549.

US Notice of Allowance dated Aug. 5, 2015 issued in U.S. Appl. No. 14/183,287.

US Office Action dated Jul. 2, 2015 issued in U.S. Appl. No. 14/187,145.

US Final Office Action dated Dec. 16, 2015 issued in U.S. Appl. No. 14/187,145.

US Notice of Allowance dated Feb. 25, 2016 issued in U.S. Appl. No. 14/187,145.

US Office Action dated Apr. 13, 2015 issued in U.S. Appl. No. 14/335,785.

US Office Action dated Oct. 1, 2015 issued in U.S. Appl. No. 14/552,245.

US Office Action dated May 25, 2016 issued in U.S. Appl. No. 14/552,011.

PCT International Search Report and Written Opinion, dated Oct. 20, 2011, issued in PCT/US2011/032186.

PCT International Preliminary Report on Patentability, dated Oct. 26, 2012, issued in PCT/US2011/032186.

Taiwan Office Action [no translation] dated Apr. 27, 2016 issued in Application No. TW 100113041.

(56) References Cited

OTHER PUBLICATIONS

PCT Invitation to Pay Additional Fees; Communication Re Partial International Search, dated Dec. 16, 2011, issued in PCT/US2011/032303.
PCT International Search Report and Written Opinion, dated Feb. 20, 2012, issued in PCT/US2011/032303.
PCT International Preliminary Report on Patentability and Written Opinion, dated Oct. 26, 2012, issued in PCT/US2011/032303.
PCT International Search Report and Written Opinion dated May 2, 2012 issued in Application No. PCT/US2011/052537.
PCT International Preliminary Report on Patentability and Written Opinion dated Apr. 4, 2013 issued in Application No. PCT/US2011/052537.
Chinese First Office Action dated Jun. 2, 2015 issued in Application No. CN 201180045808.6.
Chinese Second Office Action dated Feb. 2, 2016 issued in Application No. CN 201180045808.6.
Taiwan Office Action [no translation] dated May 5, 2016 issued in TW 100134208.
PCT International Search Report and Written Opinion dated Dec. 18, 2012, issued in Application No. PCT/US2012/052769.
PCT International Preliminary Report on Patentability and Written Opinion dated Apr. 3, 2014, issued in Application No. PCT/US2012/052769.
Chinese First Office Action dated Nov. 19, 2015 issued in Application No. CN 201280046487.6.
Taiwan Notice of Allowance and Search Report dated Dec. 18, 2015 issued in Application No. TW 101134692.
PCT International Search Report and Written Opinion dated Feb. 28, 2013, issued in Application No. PCT/US2012/051740.
PCT International Preliminary Report on Patentability and Written Opinion dated Mar. 13, 2014, issued in Application No. PCT/US2012/051740.
Chinese First Office Action dated Nov. 6, 2015 issued in Application No. CN 201280053888.4.
Taiwan Office Action and Search Report dated Jan. 27, 2016 issued in Application No. TW 101134692.
Chinese First Office Action dated May 19, 2016 issued in CN 201310021460.8.
European Extended Search Report dated Apr. 14, 2014 issued in Application No. EP 13 15 2046.
Korean Notice of Provisional Rejection dated Dec. 6, 2013 issued in Application No. KR 10-2012-0043797.
Korean Final Office Action dated Aug. 18, 2014 issued in Application No. KR 10-2012-0043797.
Korean Decision from the Patent Tribunal of the KIPO (description) dated May 26, 2015 issued in Application No. KR 10-2012-0043797.
PCT International Search Report and Written Opinion dated May 27, 2013, issued in Application No. PCT/US2013/022977.
PCT International Preliminary Report on Patentability and Written Opinion dated Aug. 7, 2014, issued in Application No. PCT/US2013/022977.
Chinese First Office Action dated Feb. 22, 2016 issued in Application No. CN 201380006994.1.
Chinese First Office Action dated Apr. 11, 2016 issued in Application No. CN 201510086588.1.
Japanese Office Action dated Apr. 19, 2016 issued in Application No. JP 2015-21804.
Korean Office Action dated Feb. 19, 2016, issued in Application No. KR 10-2015-0022610.
Cecchi et al., (2007) "Ultra-thin conformal pore-sealing of low-k materials by plasma-assisted ALD," *University of New Mexico*, Albuquerque, NM, *Sandia National Labs*, Albuquerque, NM, 1 page.
Choi, Gyu-Jin et al., (2009) "Plasma-enhanced atomic layer deposition of $TiO_2$ and Al-doped $TiO_2$ films using $N_2O$ and $O_2$ reactants," *Journal of the Electrochemical Society*, 156(9):G138-G143.

Hausmann et al. (2002) "Atomic Layer Deposition of Hafnium and Zirconium Oxides Using Metal Amide Precursors," *Chem. Mater.* 14(10):4350-4358.
Kim, H., et al., (2002) "The Growth of Tantalum Thin Films by Plasma-Enhanced Atomic Layer Deposition and Diffusion Barrier Properties," *Mat. Res. Soc. Symp. Proc.* 716:B8.5.1-B8.5.6.
King, Sean W., (Jul./Aug. 2011) "Plasma enhanced atomic layer deposition of $SiN_x$:H and $SiO_2$," *J. Vac. Sci. Technol.* A29(4):041501-1 through 041501-9 (9 pages).
Ko, Myoung-Gyun, et al., "Characterization of ruthenium thin film deposited by rf-direct plasma atomic layer deposition," *209th ECS Meeting*, Abstract #50, p. 1 [Downloaded on Jun. 9, 2014].
Ko, Myoung-Gyun, et al., (Oct. 2008) "Correlation of Carbon Content with the Thermal Stability of Ruthenium Deposited by Using RF-Direct Plasma-Enhanced Atomic-Layer Deposition," *Journal of the Korean Physical Society*, 53(4):2123-2128.
Lavareda et al., (2004) "Properties of a-Si:H TFTs using silicon carbonitride as dielectric," *Journal of Non-Crystalline Solids*, 338-340:797-801.
Lee et al., (2005) "Chemically conformal deposition of $SrTiO_3$ thin films by Atomic Layer Deposition using conventional metal organic precursors and remote-plasma activated $H_2O$," School of Materials Science and Engineering, and Inter-university Semiconductor Research Center, Seoul National University, *Microelectronic Engineering* 80:158-161.
Lee, Jong Ju, (2005) "Low-impurity, highly conformal atomic layer deposition of titanium nitride using $NH_3$—Ar—$H_2$ plasma treatment for capacitor electrodes," *Materials Letters*, 59:615-617.
Li, Xingcun, et al., (2011) "Atomic Layer Deposition $Al_2O_3$ Thin Films in Magnetized Radio Frequency Plasma Source," *Physics Procedia* 18:100-106.
Man P.F. et al., (Feb. 11-15, 1996) "Elimination of Post-Release Adhesion in Microstructures Using Conformal Fluorocarbon Coatings," *MEMS '96 Proceedings, IEEE*, pp. 55-60.
Nguyen, S.V. et al., (Jan./Mar. 1999) "Plasma-assist chemical vapor deposition of dielectric thin films for ULSI semiconductor circuits," *IBM J.Res.Develop.* 43(1.2):5-38.
Plasma Enhanced Atomic Layer Deposition (PEALD), Website: http://www.asm.com/index.php?option=com_content&task=view&id=19&Itemid=161 (2010), 1 page.
"PlasmaPro™ NGP® 80 Range," *Oxford Instruments* (2010), 8 pages.
Puurunen, Riikka L. (2005) "Surface chemistry of atomic layer deposition: A case study for the trimethylaluminum/water process," *Journal of Applied Physics*, 97:121301-1-121301-52.
van der Straten et al. (2004) "Atomic layer deposition of tantalum nitride for ultrathin liner applications in advanced copper metallization schemes," *Journal of Materials Research*, 19(2):447-453.
US Office Action dated Jul. 1, 2016 issued in U.S. Appl. No. 13/963,212.
US Office Action dated Jan. 12, 2017 issued in U.S. Appl. No. 13/963,212.
US Notice of Allowance dated Jun. 16, 2016 issued U.S. Appl. No. 14/607,997.
US Notice of Allowance dated Sep. 27, 2016 issued U.S. Appl. No. 14/607,997.
US Patent Board Decision on Appeal Before the Patent Trial and Appeal Board (Examiner Affirmed) dated Aug. 11, 2016 issued U.S. Appl. No. 13/224,240.
US Notice of Allowance dated Nov. 17, 2016 issued U.S. Appl. No. 13/224,240.
US Office Action dated Dec. 30, 2016 issued in U.S. Appl. No. 15/015,952.
US Office Action dated Feb. 3, 2017 issued in U.S. Appl. No. 14/987,542.
US Final Office Action dated Nov. 1, 2016 issued in U.S. Appl. No. 14/194,549.
US Office Action dated Aug. 1, 2016 issued in U.S. Appl. No. 14/932,869.
US Office Action dated Jun. 14, 2016 issued in U.S. Appl. No. 15/019,904.
US Notice of Allowance dated Oct. 13, 2016 issued in U.S. Appl. No. 15/019,904.

(56) References Cited

OTHER PUBLICATIONS

US Office Action dated Nov. 25, 2016 issued in U.S. Appl. No. 15/178,474.
US Final Office Action dated Aug. 24, 2016 issued in U.S. Appl. No. 14/335,785.
US Notice of Allowance dated Nov. 4, 2016 issued in U.S. Appl. No. 14/335,785.
US Notice of Allowance dated Sep. 26, 2016 issued in U.S. Appl. No. 14/552,011.
US Notice of Allowance dated Jul. 15, 2016 issued in U.S. Appl. No. 14/678,736.
Chinese Second Office Action dated Aug. 22, 2016 issued in Application No. CN 201280046487.6.
Japanese Office Action dated Aug. 23, 2016 issued in Application No. JP 2014-531838.
Singapore Supplementary Examination Report dated Jun. 1, 2016 issued in SG 11201400633R.
Chinese Second Office Action dated Aug. 16, 2016 issued in Application No. CN 201280053888.4.
Taiwan Office Action and Search Report dated Jan. 27, 2016 issued in Application No. TW 101131556.
Taiwan Office Action and Search Report dated Nov. 9, 2016 issued in Application No. TW 101131556.
Japanese Office Action dated Jan. 10, 2017 issued in JP 2013-007612.
Japanese Notification of Reasons for Rejection dated Jan. 10, 2017 issued in JP2014-554825.
Singapore Supplementary Examination Report dated Aug. 11, 2016 issued in SG 11201404315R.
Taiwan Office Action and Search Report dated Jul. 20, 2016 issued in Application No. TW 102102879.
Taiwan Office Action dated Oct. 25, 2016 issued in Application No. TW 102117772.
Taiwan Examination Report dated Jan. 11, 2017 issued in Application No. TW 102138326.
Chinese First Office Action dated Nov. 28, 2016 issued in Application No. CN 201410521390.7.
Korean Final Office Action dated Jun. 29, 2016, issued in Application No. KR 10-2015-0022610.
U.S. Appl. No. 15/201,221, Jul. 6, 2016, Kumar et al.
U.S. Appl. No. 15/253,301, Aug. 31, 2016, Ou et al.
U.S. Appl. No. 15/199,608, Jun. 30, 2016, Singhal.
US Notice of Allowance (Supplemental Notice of Allowability) dated Feb. 21, 2017 issued U.S. Appl. No. 13/224,240.
US Notice of Allowance dated Feb. 22, 2017 issued in U.S. Appl. No. 14/335,785.
US Notice of Allowance dated Mar. 21, 2017 issued in U.S. Appl. No. 14/335,785.
U.S. Appl. No. 15/426,889, Feb. 7, 2017, Swaminathan et al.
U.S. Appl. No. 15/399,637, Jan. 5, 2017, Henri et al.

\* cited by examiner

| Feature | Top Thickness (Å) | Sidewall Thickness (Å) | Bottom Thickness (Å) | Step Coverage (%) |
|---|---|---|---|---|
| High AR | 27.63 | 27.61 | 27.45 | 99.9 |
| Low AR | 28.47 | 28.21 | 27.45 | 99.1 |
| Field | 28.49 | - | - | - |

PLASMA ASSISTED ATOMIC LAYER DEPOSITION TITANIUM OXIDE FOR PATTERNING APPLICATIONS

CROSS-REFERENCE TO RELATED APPLICATIONS

This application is a continuation of U.S. application Ser. No. 15/019,904, titled "PLASMA ASSISTED ATOMIC LAYER DEPOSITION TITANIUM OXIDE FOR CONFORMAL ENCAPSULATION AND GAPFILL APPLICATIONS," filed Feb. 9, 2016, which is a continuation of U.S. application Ser. No. 14/187,145 (now U.S. Pat. No. 9,373,500), titled "PLASMA ASSISTED ATOMIC LAYER DEPOSITION TITANIUM OXIDE FOR CONFORMAL ENCAPSULATION AND GAPFILL APPLICATIONS," filed Feb. 21, 2014, and is a continuation-in-part of U.S. application Ser. No. 14/607,997, titled "PLASMA ACTIVATED CONFORMAL DIELECTRIC FILM DEPOSITION," filed Jan. 28, 2015, which is a continuation of Ser. No. 14/133,239 (now U.S. Pat. No. 8,999,859), titled "PLASMA ACTIVATED CONFORMAL DIELECTRIC FILM DEPOSITION," filed Dec. 18, 2013, which is a divisional of U.S. application Ser. No. 13/242,084 (now U.S. Pat. No. 8,637,411), titled "PLASMA ACTIVATED CONFORMAL DIELECTRIC FILM DEPOSITION," filed Sep. 23, 2011, which is a continuation-in-part of U.S. application Ser. No. 13/084,399 (now U.S. Pat. No. 8,728,956), titled "PLASMA ACTIVATED CONFORMAL FILM DEPOSITION," filed Apr. 11, 2011, which claims the benefit of U.S. Provisional Application No. 61/324,710, filed Apr. 15, 2010, 61/372,367, filed Aug. 10, 2010, 61/379,081, filed Sep. 1, 2010, and 61/417,807, filed Nov. 29, 2010, all titled "PLASMA ACTIVATED CONFORMAL FILM DEPOSITION." U.S. application Ser. No. 15/019,904 is also a continuation-in-part of application Ser. No. 14/631,637 (now U.S. Pat. No. 9,343,296), titled "APPARATUSES AND METHODS FOR DEPOSITING SIC/SICN FILMS VIA CROSS-METATHESIS REACTIONS WITH ORGANOMETALLIC CO-REACTANTS," filed Feb. 25, 2015, which is a continuation of U.S. application Ser. No. 13/738,851 (now U.S. Pat. No. 8,993,460), titled "APPARATUSES AND METHODS FOR DEPOSITING SiC/SiCN FILMS VIA CROSS-METATHESIS REACTIONS WITH ORGANOMETALLIC CO-REACTANTS," filed Jan. 10, 2013. Each of the above-identified applications is incorporated herein by reference in its entirety and for all purposes.

BACKGROUND

Memory applications have become increasingly important with the rise and spread of computing devices. A memory device is a storage device that retains information or data that can be accessed and output as needed. There are several different kinds of memory devices. Dynamic random-access memory (DRAM) is a type of random-access memory that stores each bit of data in a separate capacitor within an integrated circuit. The capacitor can be either charged or discharged, representing the two possible values of a bit (conventionally 0 and 1). DRAM has been used for a relatively long time. More recent developments in memory applications include magnetoresistive random-access memory (MRAM) and phase change random-access memory (PCRAM), for example.

Typically, a memory device will include a number of individual memory cells that encode information. The individual memory cells are separated from one another so that they can be functionally isolated. This isolation ensures that the memory cells do not interfere with one another such that the cells can function as desired. In certain cases, the memory cells are lined with an encapsulation layer. The gaps between adjacent lined memory cells may be filled with a gap filling dielectric material. The encapsulation layer and filled gaps serve to isolate adjacent memory cells.

SUMMARY

Certain embodiments herein relate to methods and apparatus for depositing an encapsulation layer over memory stacks in memory applications such as MRAM and PCRAM. The encapsulation layer is a titanium dioxide ($TiO_2$) layer deposited through an atomic layer deposition reaction. In certain implementations, the encapsulation layer may be deposited as a bilayer, with an electrically favorable layer formed atop a protective layer. In some embodiments, gaps between neighboring memory stacks may be filled with titanium oxide, for example through an atomic layer deposition reaction or a chemical vapor deposition reaction.

In one aspect of the embodiments herein, a method is provided of depositing a titanium dioxide encapsulation layer over memory stacks on a semiconductor substrate may be characterized by the following operations: (a) receiving a substrate having a plurality of magnetoresistive random access memory (MRAM) stacks or phase change random access memory (PCRAM) stacks thereon in a reaction chamber; (b) flowing a titanium-containing reactant into the reaction chamber and allowing the titanium-containing reactant to adsorb onto the surface of the substrate; (c) flowing an oxygen-containing reactant into the reaction chamber and allowing the oxygen-containing reactant to adsorb onto the surface of the substrate; and (d) exposing the reaction chamber to plasma to drive a surface reaction between the titanium-containing reactant and the oxygen-containing reactant to thereby conformally deposit a titanium dioxide encapsulation layer over the plurality of MRAM stacks or PCRAM stacks. This sequence of operations may be repeated for multiple iterations or cycles, as in an atomic layer deposition process.

In certain embodiments, the oxygen-containing reactant is or includes a weak oxidant, such as an oxidant that is not elemental oxygen ($O_3$ or $O_2$). In some cases, the oxygen-containing reactant is substantially free of strong oxidants.

In some implementations, the method is repeated to form a second encapsulation layer on the encapsulation layer. The two encapsulation layers may be deposited under different deposition conditions and/or have different properties. During deposition of the second encapsulation layer, the oxygen-containing reactant may be selected from the group consisting of oxygen, nitrous oxide, carbon monoxide, nitric oxide, nitrogen, nitrogen dioxide, oxygen, ozone, sulfur oxide, sulfur dioxide, oxygen-containing hydrocarbons, water, hydrogen peroxide, alkyl alcohols, and combinations of the foregoing.

The process conditions used to form the encapsulation layer may be varied as appropriate for the applications. In some cases, an RF power used to generate the plasma is maintained below about 125 W/deposition station, and the plasma is exposed to the substrate for a duration of about 0.5 seconds or less during each iteration (e.g., a cycle of an atomic layer deposition process). As a further example, during deposition of the second encapsulation layer, an RF power used to generate the plasma is maintained above about 500 W/station, and the plasma is exposed to the substrate for a duration of about 0.5 seconds or greater during each iteration. In implementations employing a second encapsulation layer, during deposition of the second encapsulation layer, an RF power used to generate the plasma may be maintained above about 500 W/station, and the plasma may be exposed to the substrate for a duration of about 0.5 seconds or greater during each iteration. In certain embodiments, the method is performed at a temperature of about 250° C. or less.

In some implementations, the method includes an additional operation after depositing the titanium dioxide encapsulation layer, which operation involves depositing dielectric material in gaps between adjacent MRAM or PCRAM stacks. In some cases, depositing the encapsulation layer and depositing material in gaps are performed in the same reaction chamber without removing the substrate. The gaps may be filled with titanium dioxide through the same reaction and reaction conditions used to deposit the encapsulation layer, or the gaps may be filled with titanium dioxide through different reaction conditions than used to deposit the encapsulation layer. In the second alternative, the gaps may be filled at a higher deposition rate than used to deposit the encapsulation layer.

In certain embodiments, the encapsulation layer has a thickness between about 20-500 Å. In certain embodiments, the encapsulation layer is a hermetic seal. In certain embodiments, the encapsulation layer does not substantially or selectively oxidize any of the materials in the MRAM or PCRAM stacks. In certain embodiments, the encapsulation layer does not substantially desorb hydrogen up to a temperature of at least about 500° C.

Another aspect of the disclosure concerns apparatus for depositing material on partially fabricated semiconductor substrates. Such apparatus may be characterized by the following features: (a) a reaction chamber; (b) an inlet to the reaction chamber for introducing gas phase reactants; (c) an outlet to the reaction chamber for removing material from the reaction chamber; (d) a plasma generator configured to expose the reaction chamber to plasma; and (e) a controller configured to perform operations including the following: (i) receiving a partially fabricated semiconductor substrate having a plurality of magnetoresistive random access memory (MRAM) stacks or phase change random access memory (PCRAM) stacks thereon in the reaction chamber; (ii) flowing a first titanium-containing reactant into the reaction chamber and allow the first titanium-containing reactant to adsorb onto the surface of the substrate; (iii) flowing a first oxygen-containing reactant into the reaction chamber and allow the first oxygen-containing reactant to adsorb onto the surface of the substrate; and (iv) generating a first plasma with the plasma generator, and expose the reaction chamber to the first plasma to drive a surface reaction between the titanium-containing reactant and the oxygen-containing reactant to thereby conformally deposit a first titanium dioxide encapsulation layer over the plurality of MRAM stacks or PCRAM stacks.

In certain embodiments, the controller is further configured to (v) flow a second titanium-containing reactant into the reaction chamber and allow the second titanium-containing reactant to adsorb onto the surface of the substrate; (vi) flow an second oxygen-containing reactant into the reaction chamber and allow the second oxygen-containing reactant to adsorb onto the surface of the substrate; and (vii) generate a second plasma with the plasma generator, and expose the reaction chamber to the second plasma to drive a surface reaction between the second titanium-containing reactant and the second oxygen-containing reactant to thereby conformally deposit a second titanium dioxide encapsulation layer over the first titanium dioxide encapsulation layer. In some implementations, the first titanium dioxide encapsulation layer is deposited under different conditions than the second encapsulation layer. In certain embodiments, the first oxygen-containing reactant comprises a weak oxidant, and the second oxygen-containing reactant comprises $O_2$ and/or $N_2O$.

The process conditions configured in a controller recipe may be varied as appropriate for the applications. For example, the controller may be configured to generate the first plasma at an RF power of about 125 W/station or less, and expose the first plasma to the reaction chamber for a duration of about 0.5 seconds or less per plasma exposure, and the controller may be further configured to generate the second plasma at an RF power of about 500 W/station or more, and expose the reaction chamber to the second plasma for a duration of about 0.5 seconds or more per plasma exposure.

These and other features will be described below with reference to the associated drawings.

DETAILED DESCRIPTION

Figure 1:
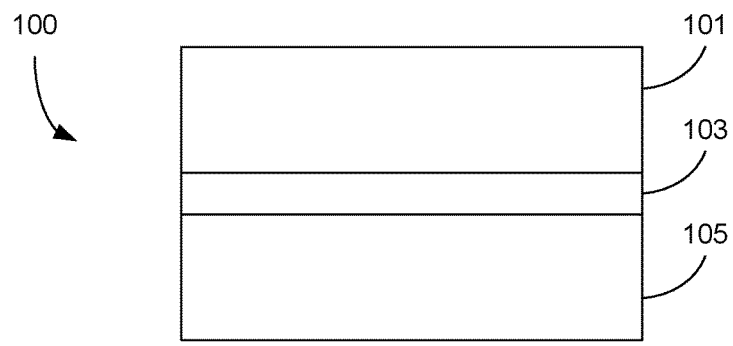
FIGS. 1, 2A and 2B illustrate a basic magnetic tunnel junction structure.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. However, the invention is not so limited. The work piece may be of various shapes, sizes, and materials. In addition to semiconductor wafers, other work pieces that may take advantage of this invention include various articles such as printed circuit boards and the like.

The flow rates and power levels provided herein are appropriate for processing on 300 mm substrates. One of ordinary skill in the art would appreciate that these flows and powers may be adjusted as necessary for substrates of other sizes. These parameters scale linearly based on substrate area. For example, an RF power of 500 W/station for a 300 mm wafer would correspond to an RF power of about 1125 W/station for a 450 mm wafer. Further, a flow rate of 1 mL/min for a 300 mm wafer would correspond to a flow rate of about 2.25 mL/min for a 450 mm wafer.

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

A memory chip includes many individual memory cells. The memory cells store bits of information (e.g., in the form of 1s and 0s) in such a way that it can be accessed as needed. In order to store large amounts of information, the memory cells are packed closely together on an integrated circuit. In order for the memory cells to function adequately at high densities, they must be isolated from one another. Otherwise, the memory cells could interfere with one another and prevent the device from working as desired.

An encapsulation layer may be used to help isolate the memory cells from one another. The encapsulation layer may be a relatively thin liner layer that conformally coats the memory cells. The encapsulation layer may be made from a dielectric material. In many cases, a silicon-based material (e.g., silicon oxide, silicon nitride or silicon carbide) is used for an encapsulation layer. After the memory cells are coated with the encapsulation layer, gaps may remain between adjacent encapsulated memory cells. These gaps may be filled with gap filling material. In various cases, the gap-filling material is a dielectric material that further serves to isolate the memory cells, and also provides mechanical support to the device. Common gap filling materials include silicon-based materials such as silicon oxide, silicon nitride and silicon carbide, for example.

Encapsulation layers must meet certain requirements to be commercially useful. In many cases, it is necessary that the encapsulation layer be deposited at a relatively low temperature, typically less than about 250° C. However, the encapsulation layer should be stable even at higher temperatures, e.g., up to about 500° C., in order to withstand thermal anneals during manufacture. Further, the encapsulation layer should exhibit high hermeticity. In other words, the encapsulation layer should be a good moisture barrier. Another desirable characteristic is that the encapsulation layer should not desorb hydrogen. Silicon-based materials have proven adequate in meeting these requirements. However, titanium oxide deposited by atomic layer deposition (ALD) may provide these same characteristics, and provides a new technique for implementing encapsulation layers and even gap filling material. The titanium oxide exhibits excellent conformality (e.g., 100% conformal), is hermetic at room temperature down to about 30 Å thickness, is stable up to at least about 500° C., and does not desorb hydrogen.

One application for the presently disclosed embodiments is in the context of magnetoresistive random-access memory (MRAM). MRAM devices store data by means of magnetic storage elements. MRAM is beneficial because it allows for dense data storage, requires relatively low power, and is non-volatile (i.e., the data is retained even if the device loses power).

MRAM devices utilize a structure known as a magnetic tunnel junction (MTJ). An MTJ includes two ferromagnetic layers separated by a thin insulating layer, sometimes referred to as a tunnel barrier layer. Current can flow from one ferromagnetic layer to another through the insulating layer by tunneling. One of the ferromagnetic layers has a magnetic field that is fixed. This layer is referred to as the fixed layer or reference layer. The other ferromagnetic layer has a magnetic field that can be changed by driving a current. This ferromagnetic layer is referred to as the free layer. The magnetic fields of the fixed and free layers can be in the same direction or in opposite directions, depending on the direction of the free layer field. When the two fields are aligned/parallel, the memory cell is in a low resistance state, representing a "0." When the two fields are in opposite directions/antiparallel, the memory cell is in a high resistance state, representing a "1."

FIG. 1 shows an example of a magnetic tunnel junction 100. A first ferromagnetic layer 101 has a variable magnetic field, and is therefore considered to be the free layer 101. A second ferromagnetic layer 105 has a fixed magnetic field, and is therefore considered to be the fixed layer. The free layer 101 and fixed layer 105 are separated by an insulating barrier layer 103, which may be made from AlO or MgO, for example. Top and bottom electrodes (not shown) may be attached to the free and fixed layers 101 and 105, respectively.

Figure 2A:
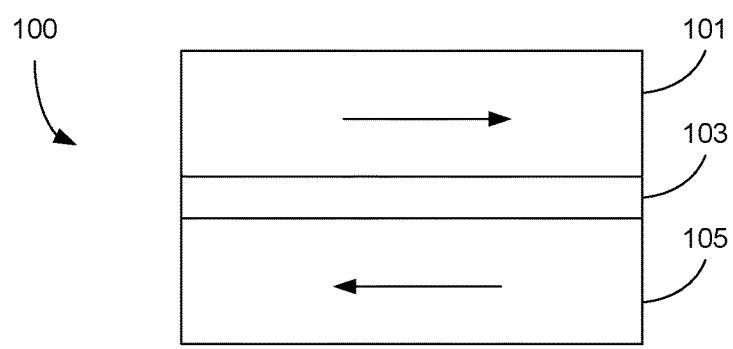
Figure 2B:
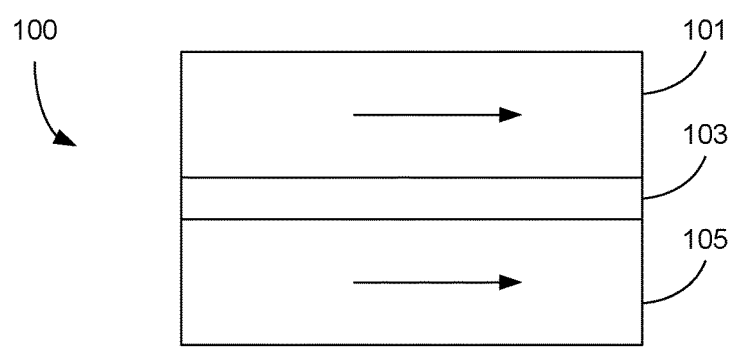

FIG. 2A illustrates the MTJ of FIG. 1 in a high resistance anti-parallel state. The arrows in FIG. 2A denote the direction of the magnetic field. Because the two ferromagnetic layers 101 and 105 have fields that are in opposite directions, the anti-parallel high resistance state is present. The memory cell indicates a "1" in this state. FIG. 2B illustrates the MTJ of FIG. 1 in a low resistance parallel state. Like in FIG. 2A, the arrows represent the direction of the magnetic field of the magnetic layers 101 and 105. Here, because both fields are in the same direction, the memory cell is in the low resistance parallel state, which indicates a "0."

Figure 3:
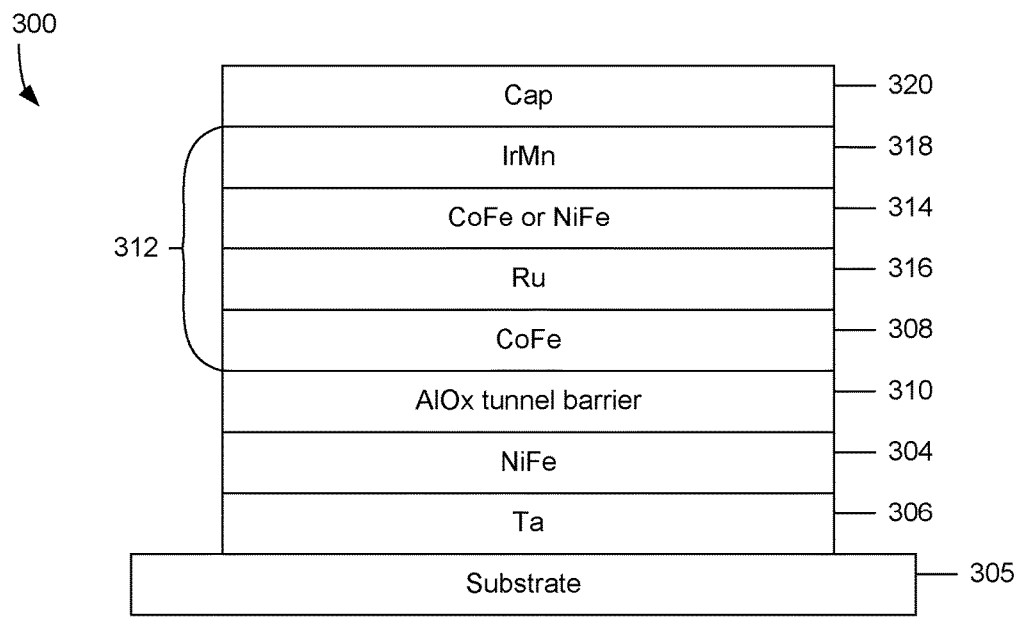
FIG. 3 presents a more complicated version of a magnetic tunnel junction structure.

The ferromagnetic layers may be provided as single layers or as stacks of individual sub-layers. FIG. 3 presents one example of a more complex form of a magnetic tunnel junction 300. The MTJ 300 includes a free ferromagnetic layer 304 formed of nickel-iron (NiFe). This free ferromagnetic layer 304 acts as a sensing layer, and is formed over a seed layer 306. In this example, the seed layer 306 is formed of tantalum. The seed layer is formed directly on the substrate 305. The free ferromagnetic layer 304 is separated from a pinned ferromagnetic layer 308 by a tunnel barrier layer 310. In this example, the tunnel barrier layer 310 is formed of aluminum oxide (AlOx), and the pinned ferromagnetic layer 308 is formed of cobalt iron (CoFe). The pinned ferromagnetic layer 308 forms part of a pinned structure 312, which may be provided in the form of a synthetic antiferromagnet (SAF). SAFs and other MRAM structures are further discussed in U.S. Pat. No. 7,072,209 and U.S. Pat. No. 8,535,954, each of which is herein incorporated by reference in its entirety.

The orientation of the magnetic field of the pinned ferromagnetic layer 308 is fixed. The orientation of this layer is maintained in a fixed state by a second ferromagnetic layer 314, which in this example may be made of cobalt-iron or nickel-iron. The second ferromagnetic layer 314 is separated from the pinned ferromagnetic layer 308 by a non-magnetic spacer layer 316. In this example, the non-magnetic spacer layer 316 is formed from a layer of ruthenium. The non-magnetic spacer layer 316 produces anti-ferromagnetic coupling between the two ferromagnetic layers 308 and 314 in the pinned structure 312. Further, an antiferromagnetic pinning layer 318, in this example formed of iridium-manganese (IrMn), may be provided above the second ferromagnetic layer 314. The antiferromagnetic pinning layer 318 operates to orient the magnetic moment of the second ferromagnetic layer 314. A pinning field is generated to fix the magnetic moment of the pinned ferromagnetic layer 308. The MTJ may also include a capping layer 320.

Although MRAM devices can have different structures, a basic MRAM device generally includes at least one magnetic layer that acts as a fixed/reference layer, at least one magnetic layer that acts as a free/sensing layer, and at least one layer in between the magnetic layers to act as a tunnel barrier.

Figure 4:
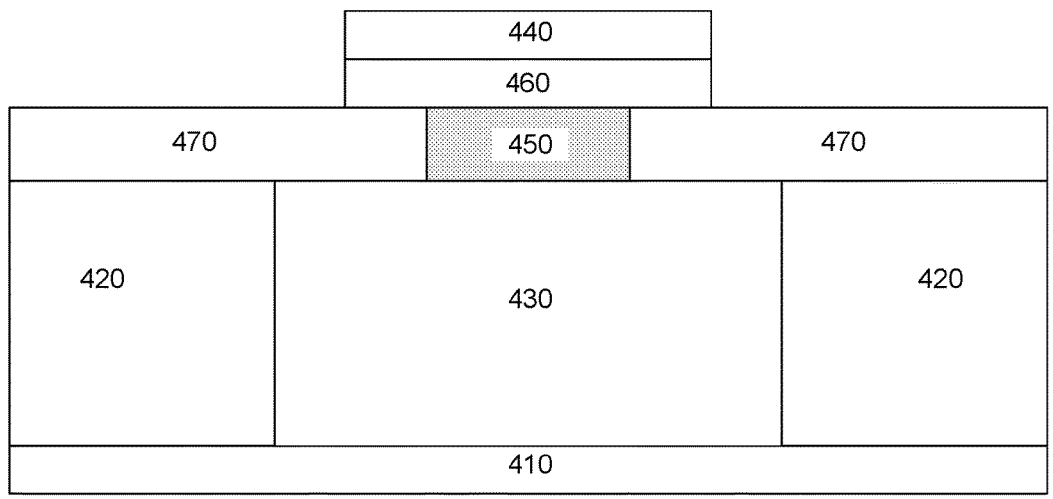
FIG. 4 shows an example of a phase change memory stack.

Another application for the disclosed embodiments is in the context of phase change random-access memory (PCRAM). PCRAM exploits the unique behavior of chalcogenide glass, a material that can transition between an amorphous and a crystalline state. FIG. 4 shows a cross-sectional view of a phase change memory cell. The cell includes a conductive layer 410, a lower electrode 430, a phase change material 460, a second electrode 440, and a heater element 450. Lower electrode 430 is in a first dielectric layer 420, and heater element 450 is in a second dielectric layer 470. The cell may be formed on a semiconductor substrate.

Phase change material 460 is typically a chalcogenide glass material, though other materials that are capable of changing from a crystalline to an amorphous state or vice versa upon application or withdrawal of heat may also be used. Because the electrical resistivity of the amorphous state of the chalcogenide material is significantly higher than the crystalline state, the phase change material can be used to store data. The amorphous, highly resistive state is used to represent one bit value (0 or 1) with the crystalline, low resistive state used to represent the other bit value.

Conductive layer 410 may be an address line, e.g., a column line, row line, bit line or word line, used to program or read information stored using the phase change material. The conductive layer may be connected to external addressing circuitry.

The electrodes are made of electrically conductive materials. In the example shown in FIG. 4, the lower electrode 430 is a plug, e.g., a tungsten plug. The first dielectric layer 420 may be silicon oxide, silicon nitride or any other type of electrically insulating material. Second dielectric material 470 is electrically and thermally insulating may be made of the same or different material as dielectric layer 420. In certain embodiments, the dielectric materials 420 and/or 470 may be titanium oxide.

Heater element 450 is a material that generates heat in response to the electrical current passing through the adjacent electrode, lower electrode 430. The resistivity of heater element 450 is high relative to that of electrode 430 to generate heat from the current. In operation a current or voltage pulse is applied to the heater element to generate heat. The heat generated by the heater element heats the phase-change material to a temperature above its crystallization temperature and below its melting temperature to achieve a crystalline state, which typically represents a bit value of 1. To change the phase change material back to its amorphous state, the heater element heats the material above its melting point. The phase change material is then quenched to achieve an amorphous state, which typically represents a bit value of 0. Different possible configurations are possible for PCRAM devices, however, a PCRAM device will typically include a phase change material and a heating material between two conductive electrodes. PCRAM structures are further discussed in U.S. Pat. No. 8,450,772, and U.S. Pat. No. 8,243,506, each of which is incorporated herein by reference in its entirety.

In MRAM and PCRAM applications, each memory cell may be used to encode a bit of information (e.g., a "0" or "1"). The memory cells are arranged in rows and columns, and must be isolated from one another to prevent interference between the cells. One method for isolating adjacent memory cells is to line them in an encapsulation layer. The encapsulation layer helps prevent interference between adjacent cells, and also protects the cells from damage from the environment, for example by preventing moisture from penetrating the memory cells.

There are various standards that encapsulation layers should meet in order to be feasible for certain commercial applications. In many memory applications, the memory stacks (i.e., the layers of material that form a memory cell) are very sensitive to oxidation. Where oxidation of the memory stack occurs, the stack materials may degrade and lose electrical and/or magnetic integrity. As such, the encapsulation layer should be deposited in a way that prevents oxidation of the memory stack materials during deposition. Also, to the relatively small extent that oxidation occurs during deposition of the encapsulation layer, oxidation should not occur in a non-uniform manner throughout the different layers of the memory stack. In other words, a deposition process that results in oxidation of certain memory stack materials but not others is particularly undesirable. Further, the encapsulation layer should provide adequate protection against future oxidation of the underlying memory stack materials after deposition.

One criteria that affects the extent of oxidation of the memory stack materials is the temperature at which the encapsulation layer is deposited. Often, the encapsulation layer is deposited through a vapor-based technique such as atomic layer deposition, which is further explained below. For certain memory applications, the encapsulation layer should be deposited at a temperature of less than about 250° C. At higher temperatures, the materials in the memory stack may start to oxidize, thereby degrading the quality and performance of the memory stack.

Another criteria that affects the extent of oxidation of the memory stack materials is the hermeticity of the encapsulation layer. Hermeticity refers to the ability of a material to block moisture transport. An encapsulation layer should be sufficiently hermetic to prevent moisture from penetrating into the memory stack. If moisture were to penetrate the encapsulation layer, it would likely result in oxidation of the underlying memory stack materials, thereby degrading the memory cell. Hermeticity of an overlying layer may be measured by the decrease in stress of a an underlying tensile TEOS film caused by exposure to the atmosphere. Without a hermetic barrier layer, the stress of a tensile TEOS film will decrease dramatically during exposure to the atmosphere, as shown below in FIG. 13, which is further described in the Experimental section. For example, the stress of a tensile 5 kÅ TEOS film decreases from $10^9$ dynes/cm$^2$ to $-10^9$ dynes/cm$^2$ after approximately one week of exposure to the atmosphere—a decrease of over 100%. Capping the tensile TEOS films with a hermetic film results in a stress change in an underlying tensile TEOS film of less than 10% after one week of exposure time.

The encapsulation layer should also be stable up to temperatures of about 500° C. Otherwise, the encapsulation layer may degrade during subsequent processing, for example during thermal anneals. On a related note, the encapsulation layer should not desorb hydrogen. Otherwise, the hydrogen can penetrate the memory stack materials and cause them to degrade. In the context of MRAM, for example, desorption of hydrogen can affect the resistive switching behavior of the free ferromagnetic layer. In many cases, it is desired that an encapsulation layer is deposited conformally to achieve good step coverage. For the purposes of this description, "step coverage" is defined as a ratio of two thicknesses, i.e., the thickness of the material inside the feature divided by the thickness of the material near the opening. For purposes of this document, the term "inside the feature" represents a middle portion of the feature located about the middle point of the feature along the feature's axis, e.g., an area between about 25% and 75% of the distance or, in certain embodiments, between about 40% and 60% of the distance along the feature's depth measured from the feature's opening, or an end portion of the feature located between about 75% and 95% of the distance along the feature's axis as measured from the opening. The term "near the opening of the feature" or "near the feature's opening" represents a top portion of the feature located within 25% or, more specifically, within 10% of the opening's edge or other element representative of the opening's edge. Step coverage of over 100% can be achieved, for example, by filling a feature wider in the middle or near the bottom of the feature than at the feature opening.

Encapsulation layers are frequently silicon-based materials deposited through chemical vapor deposition (CVD) or atomic layer deposition (ALD) techniques. ALD processes provide superior step coverage but are relatively slow. CVD techniques are faster, but provide poor step coverage. Pulsed plasma CVD techniques have been used to improve step coverage compared to more conventional CVD methods. However, pulsed plasma CVD methods result in low hermeticity films that diffuse hydrogen into the memory stack.

CVD and plasma enhanced chemical vapor deposition (PECVD) are sometimes the method of choice for depositing encapsulation layers. In a CVD reaction, one or more vapor phase reactants are provided to a reaction chamber, where they react in the gas phase before being deposited on the substrate surface. Where PECVD is used, the reaction is driven by exposure to plasma. CVD reactions are characterized by gas phase reactions.

One alternative to CVD is ALD processing and plasma enhanced atomic layer deposition (PEALD) processing. Unless otherwise noted, the term ALD is intended to include PEALD, and the term CVD is intended to include PECVD in the following description. ALD methods involve cyclic, self-limiting adsorption of reactant gases and reactions that occur directly on substrate surfaces. ALD processes can provide thin, conformal dielectric films within high aspect ratio features. ALD methods have been developed for the deposition of silicon oxide and other types of film. Films produced by ALD are very thin (e.g., about one monolayer); therefore, numerous ALD cycles may be repeated to adequately fill a gap feature.

In contrast with a CVD process, where activated gas phase reactions are used to deposit films, ALD processes use surface-mediated deposition reactions to deposit films on a layer-by-layer basis. In one example ALD process, a substrate surface, including a population of surface active sites, is exposed to a gas phase distribution of a first film precursor (P1). Some molecules of P1 may form a condensed phase atop the substrate surface, including chemisorbed species and physisorbed molecules of P1. The reactor is then evacuated to remove gas phase and physisorbed P1 so that only chemisorbed species remain. A second film precursor (P2) is then introduced to the reactor so that some molecules of P2 adsorb to the substrate surface. The reactor may again be evacuated, this time to remove unbound P2. Subsequently, energy provided to the substrate (e.g., thermal or plasma energy) activates surface reactions between adsorbed molecules of P1 and P2, forming a film layer. Finally, the reactor is evacuated to remove reaction by-products and possibly unreacted P1 and P2, ending the ALD cycle. Additional ALD cycles may be included to build film thickness.

Depending on the exposure time of the precursor dosing steps and the sticking coefficients of the precursors, each ALD cycle may deposit a film layer of, in one example, between about 0.5 Å-3 Å thick.

A related deposition technique that presents a feasible alternative to CVD for small feature sizes is conformal film deposition (CFD). Generally, CFD does not rely on complete purges of one or more reactants prior to reaction to form the film. For example, there may be one or more reactants present in the vapor phase when a plasma (or other activation energy) is struck. Accordingly, one or more of the process steps described in an ALD process (e.g., a purge step) may be shortened or eliminated in an example CFD process. In some cases, a reactant may be provided continuously. The continuously provided reactant is often a co-reactant/auxiliary reactant (e.g., an oxygen- or nitrogen-containing reactant, as opposed to a primary reactant such as one that contributes silicon to a final film). It is generally necessary, even in CFD processes, to minimize the amount of non-adsorbed principal reactant in the reaction chamber when the chamber is exposed to plasma. Otherwise, a gas phase CVD reaction may result. Typically, a chamber capable of performing an ALD process is also capable of performing a CFD process, and as used herein, a CFD process is considered to be a type of ALD process.

Encapsulation layers have typically been formed from silicon-based materials. However, it has been found that titanium oxide deposited through PEALD techniques can meet all of the standards set forth above for commercially feasible encapsulation layers. In particular, the titanium oxide films show excellent step coverage (e.g., about 100% step coverage), are stable up to at least about 500° C., and do not desorb hydrogen. Further, oxidation damage to the underlying magnetic stack materials during deposition can be minimized in a number of ways.

Figure 5:
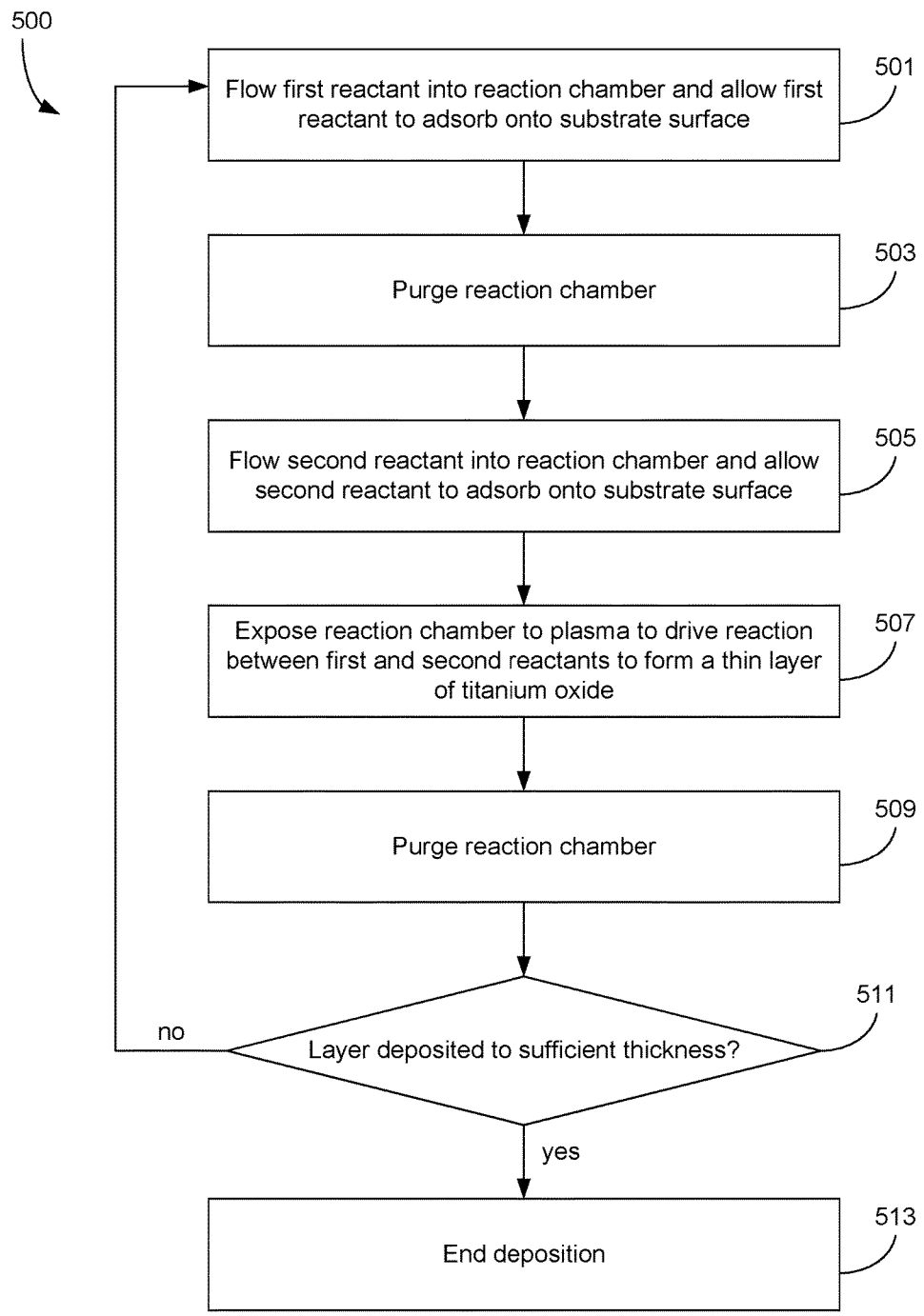
FIG. 5 is a flowchart describing a method of forming an encapsulation layer on a memory stack.

FIG. 5 presents a flowchart for a method of depositing a titanium oxide encapsulation layer through a PEALD process. The method 500 begins at operation 501, where a first reactant flows into the reaction chamber and is allowed to adsorb onto the surface of the substrate. In one example, the first reactant includes tetrakis dimethylamido titanium (TDMATi, $[(CH_3)_2N]_4Ti$). Other potential first reactants include Bis(tert-butylcyclopentadienyl)titanium(IV) dichloride ($C_{18}H_{26}Cl_2Ti$), Tetrakis(diethylamido)titanium ($[(C_2H_5)_2N]_4Ti$), Tetrakis(ethylmethylamido)titanium ($[(CH_3C_2H_5)N]_4Ti$), Titanium diisopropoxidebis(2,2,6,6-tetramethyl-3,5-heptanedionate) ($Ti[OCC(CH_3)_3CHCOC(CH_3)_3]_2(OC_3H_7)2$), Titanium(IV) isopropoxide ($Ti[OCH(CH_3)_2]_4$), and Titanium tetrachloride ($TiCl_4$), for example, though the embodiments are not so limited.

The first reactant may flow into the reaction chamber for a duration between about 0.1-5 seconds, for example about 1 second. The first reactant may flow at a rate between about 0.5-3 mL/min, for example between about 0.5-1 mL/min, as measured before the reactant is vaporized. The temperature in the reaction chamber may be between about 50-300° C. In various cases, the reaction temperature is below about 250° C. The pressure in the reaction chamber may be between about 1-10 Torr, for example between about 2-4 Torr.

The method continues at operation 503, where the reaction chamber is purged. The purge may include evacuating the reaction chamber and/or sweeping the reaction chamber with a gas that does not include the species to be purged. In this example, a suitable sweep gas is one that does not include the first reactant. The purge may have a duration between about 0.1-25 seconds. Where a sweep gas is used, a flow rate of the sweep gas during the purge may be between about 5-60 slm. The purpose of the purge is to remove unadsorbed first reactant from the reaction chamber.

Next, at operation 505 a second reactant is flowed into the reaction chamber and allowed to adsorb onto the substrate surface. In one example, the second reactant includes carbon dioxide ($CO_2$). Alternatively or in addition, the second reactant may include carbon monoxide (CO), nitric oxide (NO), nitrous oxide ($N_2O$), nitrogen ($N_2$), nitrogen dioxide ($NO_2$), oxygen ($O_2$), ozone ($O_3$), sulfur oxide (SO), sulfur dioxide ($SO_2$), oxygen-containing hydrocarbons ($C_xH_yO_z$), water ($H_2O$), hydrogen peroxide ($H_2O_2$), alkyl alcohols (e.g, methanol, ethanol, etc.), mixtures thereof, etc. The second reactant may be provided for a duration between about 0.1-5 seconds, for example about 0.5-1 seconds.

At operation 507, the reaction chamber is exposed to plasma to drive a reaction between the first and second reactants on the surface of the substrate to form a thin layer of titanium oxide. Each reaction cycle may deposit about a monolayer of material. Various types of plasma may be used to drive this reaction including capacitively coupled plasmas and inductively coupled plasmas. Different types of plasma generators may be used including RF, DC, and microwave plasma generators. Moreover, according to various embodiments, the plasma may be direct or remote. Where an RF generator is employed, an RF power used to drive plasma formation may be between about 50-2500 W/station, for example about 625 W/station. There may be a number of stations in a single chamber. In one example, there are four individual stations in a single reaction chamber, though additional or fewer stations may be used. The frequency used to generate the plasma may include a high frequency (HF) and/or a low frequency (LF) component. In certain embodiments, the frequency used to generate plasma may be between about 13.56-40 MHz, for example about 13.56 MHz. The duration of plasma exposure may be between about 0.1-5 seconds, for example about 0.5-1 seconds. In some embodiments, operations 505 and 507 may occur at least partially at the same time such that plasma is generated while the second reactant is being supplied to the reaction chamber. Next, a purge may occur at operation 509. This purge may be implemented as an evacuation and/or sweep of the reaction chamber, and is done to help remove any unadsorbed species and film byproducts. The method may be repeated to form a film having a desired thickness. As such, in block 511, the thickness of the deposited film is compared to a desired film thickness. If the film has reached a sufficient thickness, the deposition ends at block 513. On the other hand, if the deposition has not reached a sufficient thickness, the method may be repeated starting at block 501.

In some cases, an encapsulation layer is deposited to a thickness of at least about 20 Å, or at least about 30 Å. The encapsulation layer may have a thickness between about 20-500 Å, for example between about 30-100 Å in some embodiments. Typically, the encapsulation layer will grow at a rate between about 0.6-1.1 Å/cycle.

In certain embodiments, extra care is taken to minimize any oxidation of underlying memory stack materials during deposition of the titanium oxide encapsulation layer. One method for minimizing oxidation of underlying materials is to use a gentle oxidation reactant. In the context of FIG. 5, the oxidation reactant is the second reactant. Examples of gentle/weak oxidation reactants include $CO_2$, and oxygen-containing hydrocarbons. One example of a reactant that does not qualify as gentle oxidation reactant is elemental oxygen ($O_2$ or $O_3$). Another method for minimizing oxidation of underlying memory stack materials during deposition of an encapsulation layer is to use gentle plasma conditions. These gentle plasma conditions are sometimes referred to as "soft landing" conditions. The relative harshness of plasma conditions depends on the power used to generate the plasma (higher powers lead to harsher plasmas) as well as the duration of plasma exposure (longer plasma exposures are harsher). Where a soft plasma landing is desired, the RF power may be maintained below about 125 W/station, for example between about 50-125 W/station, and the plasma exposure may have a duration of about 0.5 seconds or less, for example between about 0.1-0.5 seconds.

Another method for minimizing oxidation damage to the substrate is to deposit the encapsulation layer as a bilayer. A first layer may be a protective layer (sometimes also referred to as a first encapsulation layer) and a second layer may be an electrically favorable layer (sometimes also referred to as a second encapsulation layer). The protective layer may be deposited directly on the memory stack, and may be deposited under gentle oxidation conditions, for example with a gentle oxidant (e.g., $CO_2$) and/or with a soft plasma landing (e.g., the RF power used to generate the plasma may be about 125 W/station or less, and the plasma may be exposed for a duration of about 0.5 seconds or less during formation of the protective layer). In some embodiments, the electrically favorable layer is formed at a higher temperature than the protective layer. The first layer prevents or minimizes oxidation of the stack materials. However, this protective layer may have relatively poor electrical properties. For example, the protective layer may have low breakdown voltage (BDV) and high leakage current due to insufficient oxidative conversion of the precursors. The protective layer may have a higher carbon content and/or a higher hydrogen content than an electrically favorable layer. These relatively high carbon and/or hydrogen levels may lead to the poor electrical qualities of the protective layer.

To remedy the poor electrical qualities of the protective layer, this layer may be integrated into a bilayer with a more electrically favorable layer. The electrically favorable layer may be deposited directly on the protective layer. Because the protective layer is present to shield the underlying memory stack materials from oxidation, harsher oxidation conditions may be used to deposit the electrically favorable layer without risking damage to the underlying materials. The electrically favorable layer may be deposited using a less gentle oxidation reactant. For instance, the electrically favorable layer may be deposited using $O_2$, $N_2O$, or a mixture thereof. The electrically favorable layer may be deposited using relatively harsh plasma conditions. Where this is the case, the RF power used to deposit the electrically favorable layer may be at least about 500 W/station, or at least about 625 W/station. The duration of plasma exposure for a single ALD cycle during formation of the electrically favorable layer may be at least about 0.5 seconds, for example at least about 1 second.

Where an encapsulation layer is deposited as a bilayer, the protective layer should be sufficiently thick to protect the underlying materials from oxidation (i.e., the layer must be thick enough to provide sufficient hermeticity). Further, the protective layer should be thick enough to form a coalescent layer that does not have pinholes or other form of incomplete coverage. In some embodiments, a protective layer has a thickness of at least about 20 Å. The protective layer may have a thickness between about 20-500 Å, for example between about 30-100 Å in some embodiments.

Figure 6:
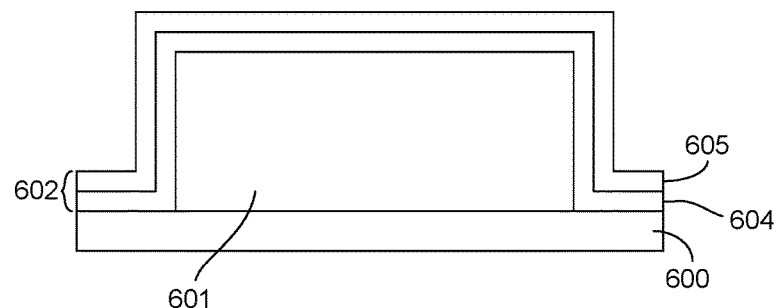
FIG. 6 illustrates a bilayer encapsulation layer.

FIG. 6 shows a bilayer encapsulation layer 602 deposited over a memory stack 601 on substrate 600. The memory stack is depicted as a single block, though it is understood that the stack includes several individual layers that operate together. The encapsulation layer 602 includes protective layer 604 and electrically favorable layer 605.

Previously, titanium oxide has not been used as an encapsulation layer for protecting MRAM and PCRAM stacks in part due to the relatively harsh plasma conditions used during conventional titanium oxide deposition, and the sensitivity of the stack materials to oxidation. The harsh plasma conditions would result in unacceptably high levels of oxidation of the underyling stack materials. More gentle plasma conditions (RF power, plasma exposure time) could be used, but would result in films that are likely to flake off, or that have unacceptably high levels of carbon due to the presence of precursors. However, various methods disclosed herein overcome these problems. In some embodiments, a gentle oxidation reactant is used to prevent oxidation of stack materials. In other embodiments, a bilayer approach is used to prevent oxidation of the stack while ensuring that the encapsulation layer has good electrical properties.

Figure 7:
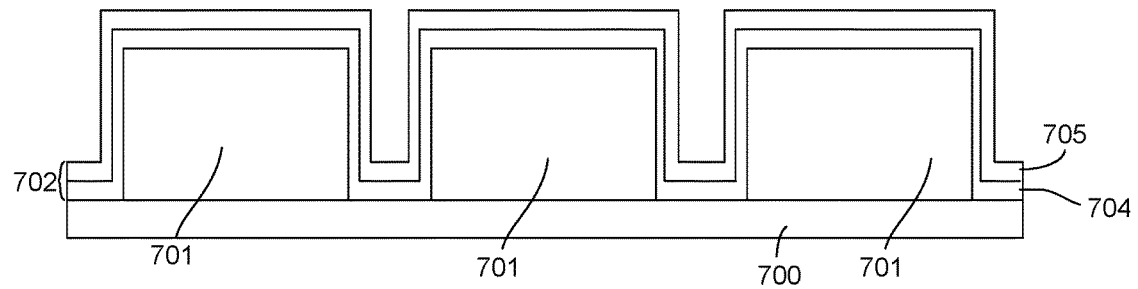
FIG. 7 illustrates a bilayer encapsulation layer over several memory stacks.

FIG. 7 illustrates a substrate 700 having a plurality of memory stacks 701 deposited thereon. The memory stacks 701 may be MRAM or PCRAM stacks, for example. The stacks 701 are coated with a bilayer of material 702. The bilayer includes a lower protective layer 704 and an upper electrically favorable layer 705. In some embodiments, the spaces between adjacent lined stacks are filled with gap filling material.

After a collection of memory stacks are lined with an encapsulation layer, the encapsulated stacks are separated by gaps, as shown in FIG. 7. These gaps may be filled with a dielectric material through a CVD or ALD process, for example. In certain cases, the gaps are filled with a silicon-based material such as silicon oxide or silicon nitride. In other cases, the gaps may be filled with a non-silicon based material. One example of a non-silicon based material that may be used to fill the gaps is titanium oxide. In some embodiments, both the encapsulation layer and the gap filling material are titanium oxide. In a particular embodiment, the encapsulation layer deposition process is extended in duration such that instead of merely lining the memory stacks, the ALD-deposited titanium oxide fills the entire region between adjacent memory stacks. In general, the encapsulation layer needs to be of high quality to adequately protect underlying materials. In contrast, there is much more flexibility on the quality and properties of a gap filling material.

Where titanium oxide is used to both line the memory stacks and fill the gaps between the stacks, a number of processing methods may be used. In one case, both parts of the process (lining the stacks and filling the gaps between stacks) are performed in a single step, under the same deposition conditions. In this case, there may be substantially no difference between the material lining the stacks and filling the gaps. In another embodiment, both parts of the process are performed under the same conditions, but additional processing steps may be taken between deposition of the encapsulation layer and the gap filling material. One example of a process that may occur in between these two steps is a thermal anneal. During a thermal anneal, the substrate may be raised to an elevated temperature, for example at least about 300° C., or at least about 400° C., or at least about 500° C.

In certain other embodiments, the encapsulation layer and gap filling material may each be deposited through an ALD process, but the deposition conditions may be different between the two processes. For instance, the gap filling material may be deposited at a higher deposition rate, using shorter purges, etc.

In some implementations, the encapsulation layer and gap filling material may be deposited through different kinds of processes. For instance, the encapsulation layer may be deposited through an ALD process, and the gap filling material may be deposited through a CVD process, for example a pulsed plasma CVD process. The encapsulation layer and gap filling material may each be titanium oxide. Other materials may also be used for the gap filling material, as mentioned. For instance, the gap filling material may be SiN or SiC deposited through a pulsed plasma CVD process.

Figure 8:
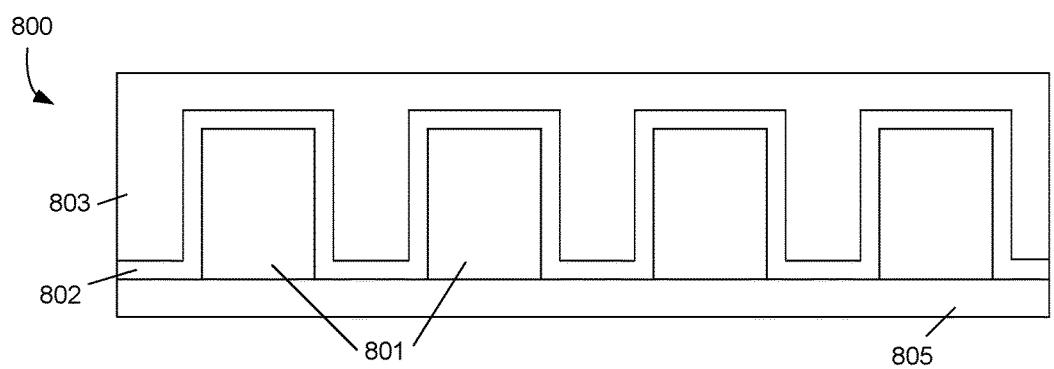
FIG. 8 shows a simplified cross-sectional view of a substrate having memory stacks lined with an encapsulation layer, where the gaps between the memory stacks are filled with a gap filling material.

FIG. 8 illustrates a simplified cross-sectional view of a memory device 800 having a number of individual memory stacks 801 covered by an encapsulation layer 802 and positioned on a substrate 805. The gaps between the encapsulated memory stacks 801 are filled with gap filling material 803. Encapsulation layer 802 may be formed from titanium oxide through an ALD process as described herein. The gap filling material 803 may be titanium oxide deposited through an ALD process, titanium oxide deposited through a CVD process, or some other dielectric material. Though gap filling material 803 is shown as having a flat top portion, the shape of film deposited in this region will depend on the deposition conditions and process. The material may need to be planarized before reaching the state shown in FIG. 8.

In certain embodiments, the ALD-deposited $TiO_2$ may be used as a cap layer in front end of line (FEOL) logic devices. Memory encapsulation layers and FEOL application layers such as high-K (high dielectric constant) layers for MIM capacitors in DRAM, interpoly dielectric in 3D NAND, etc. require similar film properties (protection against oxidation, hermeticity, film stability, etc.). Thus, ALD-deposited $TiO_2$ is a promising material for this application, as well. Where $TiO_2$ is used as a cap layer in FEOL logic devices, it will typically involve deposition of the $TiO_2$ material over an electrically active device/gate. For instance, each gate that covers a metal oxide semiconductor or capacitor may be lined with an encapsulation layer to isolate it from neighboring transistors. In some embodiments, these encapsulation layers may be titanium oxide deposited through an ALD process as described herein.

Apparatus

Figure 9:
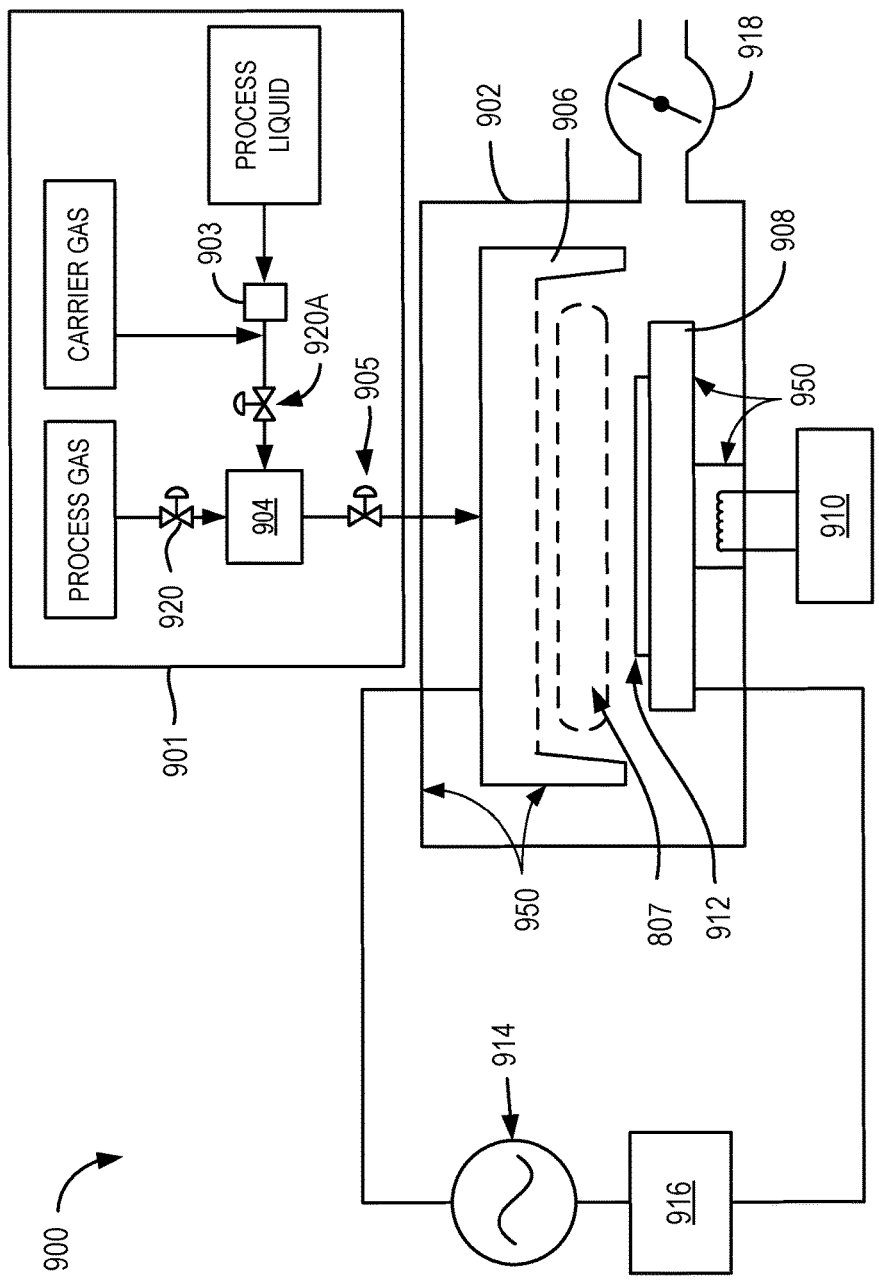
FIG. 9 presents an example of a reaction chamber that may be used to practice the disclosed embodiments.
Figure 10:
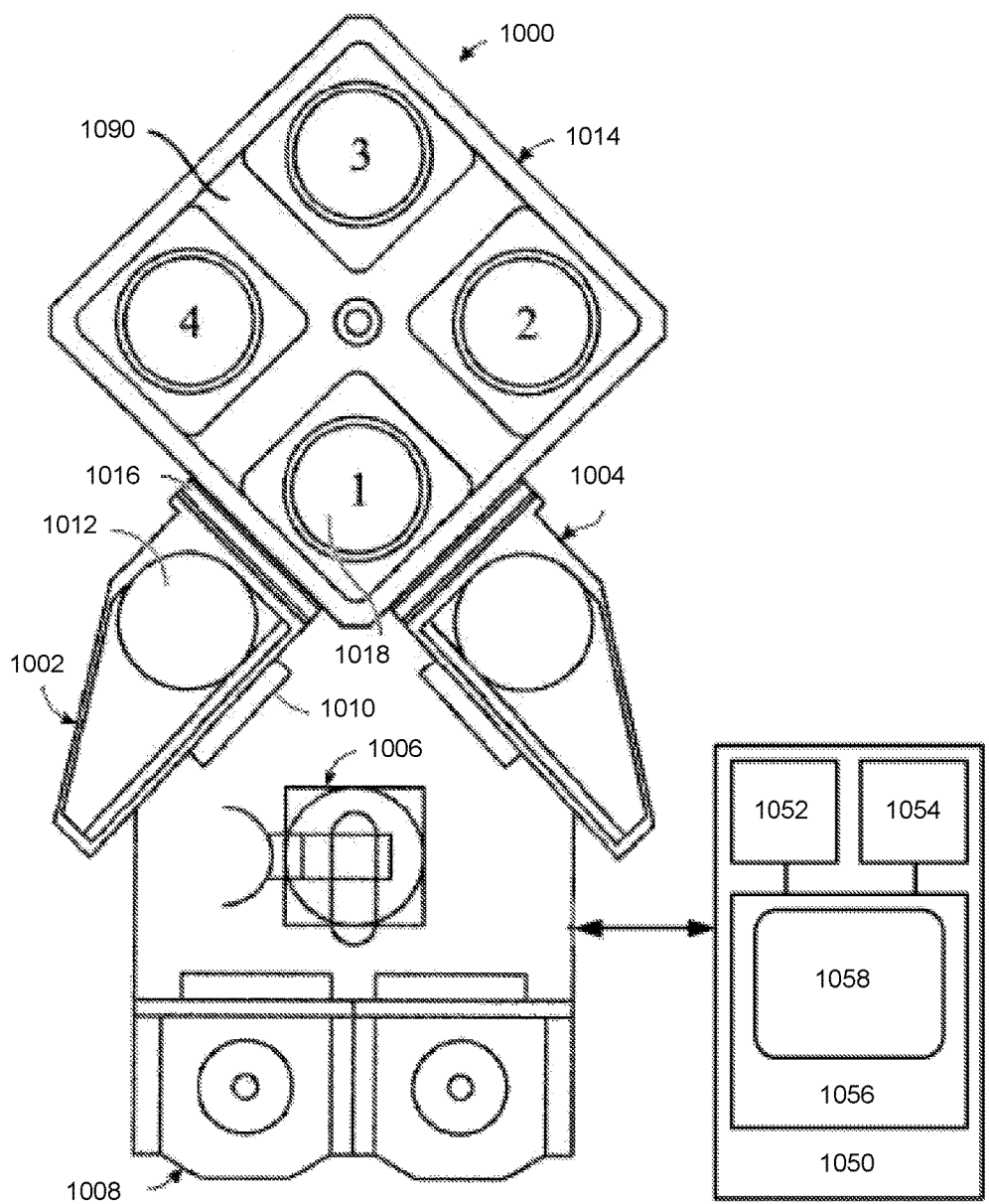
FIG. 10 presents a multi-tool apparatus that may be used to practice the disclosed embodiments.

FIG. 9 schematically shows an embodiment of a reaction chamber process station 900. For simplicity, process station 900 is depicted as a standalone process station having a process chamber body 902 for maintaining a low-pressure environment. However, it will be appreciated that a plurality of process stations 900 may be included in a common process tool environment. For example, FIG. 10 depicts an embodiment of a multi-station processing tool. Further, it will be appreciated that, in some embodiments, one or more hardware parameters of process station 900, including those discussed in detail above, may be adjusted programmatically by one or more computer controllers.

Process station 900 fluidly communicates with reactant delivery system 901 for delivering process gases to a distribution showerhead 906. Reactant delivery system 901 includes a mixing vessel 904 for blending and/or conditioning process gases for delivery to showerhead 906. One or more mixing vessel inlet valves 920 may control introduction of process gases to mixing vessel 904.

Some reactants may be stored in liquid form prior to vaporization at and subsequent delivery to the process station. The embodiment of FIG. 9 includes a vaporization point 903 for vaporizing liquid reactant to be supplied to mixing vessel 904. In some embodiments, vaporization point 903 may be a heated vaporizer. The saturated reactant vapor produced from such vaporizers may condense in downstream delivery piping when adequate controls are not in place. Exposure of incompatible gases to the condensed reactant may create small particles. These small particles may clog piping, impede valve operation, contaminate substrates, etc. Some approaches to addressing these issues involve sweeping and/or evacuating the delivery piping to remove residual reactant. However, sweeping the delivery piping may increase process station cycle time, degrading process station throughput. Thus, in some embodiments, delivery piping downstream of vaporization point 903 may be heat traced. In some examples, mixing vessel 904 may also be heat traced. In one non-limiting example, piping downstream of vaporization point 903 has an increasing temperature profile extending from approximately 100° C. to approximately 150° C. at mixing vessel 904.

As mentioned, in some embodiments the vaporization point 903 is a heated liquid injector. A liquid injector may inject pulses of a liquid reactant into a carrier gas stream upstream of the mixing vessel. In one scenario, a liquid injector may vaporize reactant by flashing the liquid from a higher pressure to a lower pressure. In another scenario, a liquid injector may atomize the liquid into dispersed microdroplets that are subsequently vaporized in a heated delivery pipe. It will be appreciated that smaller droplets may vaporize faster than larger droplets, reducing a delay between liquid injection and complete vaporization. Faster vaporization may reduce a length of piping downstream from vaporization point 903. In one scenario, a liquid injector may be mounted directly to mixing vessel 904. In another scenario, a liquid injector may be mounted directly to showerhead 906.

In some embodiments, a liquid flow controller upstream of vaporization point 903 may be provided for controlling a mass flow of liquid for vaporization and delivery to process station 900. For example, the liquid flow controller (LFC) may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, the LFC may be dynamically switched from a feedback control mode to a direct control mode by disabling a sense tube of the LFC and the PID controller.

Showerhead 906 distributes process gases toward substrate 912. In the embodiment shown in FIG. 9, substrate 912 is located beneath showerhead 906, and is shown resting on a pedestal 908. It will be appreciated that showerhead 906 may have any suitable shape, and may have any suitable number and arrangement of ports for distributing processes gases to substrate 912.

In some embodiments, a microvolume 907 is located beneath showerhead 906. Performing a CFD process in a microvolume rather than in the entire volume of a process station may reduce reactant exposure and sweep times, may reduce times for altering process conditions (e.g., pressure, temperature, etc.), may limit an exposure of process station robotics to process gases, etc. Example microvolume sizes include, but are not limited to, volumes between 0.1 liter and 2 liters.

In some embodiments, pedestal 908 may be raised or lowered to expose substrate 912 to microvolume 907 and/or to vary a volume of microvolume 907. For example, in a substrate transfer phase, pedestal 908 may be lowered to allow substrate 912 to be loaded onto pedestal 908. During a deposition on substrate process phase, pedestal 908 may be raised to position substrate 912 within microvolume 907. In some embodiments, microvolume 907 may completely enclose substrate 912 as well as a portion of pedestal 908 to create a region of high flow impedance during a deposition process.

Optionally, pedestal 908 may be lowered and/or raised during portions the deposition process to modulate process pressure, reactant concentration, etc., within microvolume 907. In one scenario where process chamber body 902 remains at a base pressure during the process, lowering pedestal 908 may allow microvolume 907 to be evacuated. Example ratios of microvolume to process chamber volume include, but are not limited to, volume ratios between 1:500 and 1:10. It will be appreciated that, in some embodiments, pedestal height may be adjusted programmatically by a suitable computer controller.

In another scenario, adjusting a height of pedestal 908 may allow a plasma density to be varied during plasma activation and/or treatment cycles included in the deposition process. At the conclusion of the deposition process phase, pedestal 908 may be lowered during another substrate transfer phase to allow removal of substrate 912 from pedestal 908.

While the example microvolume variations described herein refer to a height-adjustable pedestal, it will be appreciated that, in some embodiments, a position of showerhead 906 may be adjusted relative to pedestal 908 to vary a volume of microvolume 907. Further, it will be appreciated that a vertical position of pedestal 908 and/or showerhead 906 may be varied by any suitable mechanism within the scope of the present disclosure. In some embodiments, pedestal 908 may include a rotational axis for rotating an orientation of substrate 912. It will be appreciated that, in some embodiments, one or more of these example adjustments may be performed programmatically by one or more suitable computer controllers.

Returning to the embodiment shown in FIG. 9, showerhead 906 and pedestal 908 electrically communicate with RF power supply 914 and matching network 916 for powering a plasma. In some embodiments, the plasma energy may be controlled by controlling one or more of a process station pressure, a gas concentration, an RF source power, an RF source frequency, and a plasma power pulse timing. For example, RF power supply 914 and matching network 916 may be operated at any suitable power to form a plasma having a desired composition of radical species. Examples of suitable powers are included above. Likewise, RF power supply 914 may provide RF power of any suitable frequency. In some embodiments, RF power supply 914 may be configured to control high- and low-frequency RF power sources independently of one another. Example low-frequency RF frequencies may include, but are not limited to, frequencies between 50 kHz and 500 kHz. Example high-frequency RF frequencies may include, but are not limited to, frequencies between 1.8 MHz and 2.45 GHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, the plasma may be controlled via input/output control (IOC) sequencing instructions. In one example, the instructions for setting plasma conditions for a plasma activation phase may be included in a corresponding plasma activation recipe phase of a process recipe. In some cases, process recipe phases may be sequentially arranged, so that all instructions for a process phase are executed concurrently with that process phase. In some embodiments, instructions for setting one or more plasma parameters may be included in a recipe phase preceding a plasma process phase. For example, a first recipe phase may include instructions for setting a flow rate of an inert and/or a reactant gas, instructions for setting a plasma generator to a power set point, and time delay instructions for the first recipe phase. A second, subsequent recipe phase may include instructions for enabling the plasma generator and time delay instructions for the second recipe phase. A third recipe phase may include instructions for disabling the plasma generator and time delay instructions for the third recipe phase. It will be appreciated that these recipe phases may be further subdivided and/or iterated in any suitable way within the scope of the present disclosure.

In some deposition processes, plasma strikes last on the order of a few seconds or more in duration. In certain implementations described herein, much shorter plasma strikes may be applied during a processing cycle. These may be on the order of 50 ms to 1 second, with 0.25 seconds being a specific example. Such short RF plasma strikes require quick stabilization of the plasma. To accomplish this, the plasma generator may be configured such that the impedance match is preset to a particular voltage, while the frequency is allowed to float. Conventionally, high-frequency plasmas are generated at an RF frequency at about 13.56 MHz. In various embodiments disclosed herein, the frequency is allowed to float to a value that is different from this standard value. By permitting the frequency to float while fixing the impedance match to a predetermined voltage, the plasma can stabilize much more quickly, a result which may be important when using the very short plasma strikes associated with ALD/CFD cycles.

In some embodiments, pedestal 908 may be temperature controlled via heater 910. Further, in some embodiments, pressure control for process station 900 may be provided by butterfly valve 918. As shown in the embodiment of FIG. 9, butterfly valve 918 throttles a vacuum provided by a downstream vacuum pump (not shown). However, in some embodiments, pressure control of process station 900 may also be adjusted by varying a flow rate of one or more gases introduced to process station 900.

The internal surfaces of the process station 900 may be coated with conditioning layer 950, which may include an undercoat and/or a pre-deposition coat. Examples of surfaces that become coated with the conditioning layer include the chamber walls 902, the chamber ceiling and floor, the pedestal 908 and the showerhead 906. Although FIG. 9 is shown with a substrate 912 in the process station 900, this substrate 912 is not present during deposition of the one or more conditioning layers. Instead, the substrate 912 is introduced to the process station 900 after the conditioning layers are deposited, when the process station 900 is ready to be used for depositing film on the substrate 912.

As described above, one or more process stations may be included in a multi-station processing tool. FIG. 10 shows a schematic view of an embodiment of a multi-station processing tool 1000 with an inbound load lock 1002 and an outbound load lock 1004, either or both of which may comprise a remote plasma source. A robot 1006, at atmospheric pressure, is configured to move wafers from a cassette loaded through a pod 1008 into inbound load lock 1002 via an atmospheric port 1010. A wafer is placed by the robot 1006 on a pedestal 1012 in the inbound load lock 1002, the atmospheric port 1010 is closed, and the load lock is pumped down. Where the inbound load lock 1002 comprises a remote plasma source, the wafer may be exposed to a remote plasma treatment in the load lock prior to being introduced into a processing chamber 1014. Further, the wafer also may be heated in the inbound load lock 1002 as well, for example, to remove moisture and adsorbed gases. Next, a chamber transport port 1016 to processing chamber 1014 is opened, and another robot (not shown) places the wafer into the reactor on a pedestal of a first station shown in the reactor for processing. While the embodiment depicted in FIG. 10 includes load locks, it will be appreciated that, in some embodiments, direct entry of a wafer into a process station may be provided.

The depicted processing chamber 1014 comprises four process stations, numbered from 1 to 4 in the embodiment shown in FIG. 10. Each station has a heated pedestal (shown at 1018 for station 1), and gas line inlets. It will be appreciated that in some embodiments, each process station may have different or multiple purposes. For example, in some embodiments, a process station may be switchable between an ALD mode, a CFD mode, and a CVD process mode. Additionally or alternatively, in some embodiments, processing chamber 1014 may include one or more matched pairs of ALD/CFD/CVD process stations. While the depicted processing chamber 1014 comprises four stations, it will be understood that a processing chamber according to the present disclosure may have any suitable number of stations. For example, in some embodiments, a processing chamber may have five or more stations, while in other embodiments a processing chamber may have three or fewer stations.

FIG. 10 also depicts an embodiment of a wafer handling system 1090 for transferring wafers within processing chamber 1014. In some embodiments, wafer handling system 1090 may transfer wafers between various process stations and/or between a process station and a load lock. It will be appreciated that any suitable wafer handling system may be employed. Non-limiting examples include wafer carousels and wafer handling robots. FIG. 10 also depicts an embodiment of a system controller 1050 employed to control process conditions and hardware states of process tool 1000. System controller 1050 may include one or more memory devices 1056, one or more mass storage devices 1054, and one or more processors 1052. Processor 1052 may include a CPU or computer, analog and/or digital input/output connections, stepper motor controller boards, etc.

In some embodiments, system controller 1050 controls all of the activities of process tool 1000. System controller 1050 executes system control software 1058 stored in mass storage device 1054, loaded into memory device 1056, and executed on processor 1052. System control software 1058 may include instructions for controlling the timing, mixture of gaseous and liquid reactants, chamber and/or station pressure, chamber and/or station temperature, wafer temperature, target power levels, RF power levels, RF exposure time, substrate pedestal, chuck and/or susceptor position, and other parameters of a particular process performed by process tool 1000. These programmed processes may include various types of processes including, but not limited to, processes related to deposition of an undercoat, processes related to deposition of film on substrates, and processes related to cleaning the chamber. System control software 1058 may be configured in any suitable way. For example, various process tool component subroutines or control objects may be written to control operation of the process tool components necessary to carry out various process tool processes. System control software 1058 may be coded in any suitable computer readable programming language.

In some embodiments, system control software 1058 may include input/output control (IOC) sequencing instructions for controlling the various parameters described above. For example, each phase of an encapsulation layer deposition process may include one or more instructions for execution by system controller 1050. The instructions for setting process conditions for an encapsulation layer deposition process phase may be included in a corresponding encapsulation layer deposition recipe phase. In some embodiments, the recipe phases may be sequentially arranged, so that all instructions for a process phase are executed concurrently with that process phase.

Other computer software and/or programs stored on mass storage device 1054 and/or memory device 1056 associated with system controller 1050 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 1018 and to control the spacing between the substrate and other parts of process tool 1000. The positioning program may include instructions for appropriately moving substrates in and out of the reaction chamber as necessary to deposit the conditioning layers, deposit films on substrates, and clean the chamber. These may include instructions for ensuring that no substrates are present in the reaction chamber during deposition of the conditioning layers and during the cleaning process.

A process gas control program may include code for controlling gas composition and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively or in addition, the heater control program may control delivery of a heat transfer gas (such as helium) to the substrate. A plasma control program may include code for setting RF power levels, frequencies, and exposure times in one or more process stations in accordance with the embodiments herein.

In some embodiments, there may be a user interface associated with system controller 1050. The user interface may include a display screen, graphical software displays of the apparatus and/or process conditions, and user input devices such as pointing devices, keyboards, touch screens, microphones, etc.

In some embodiments, parameters adjusted by system controller 1050 may relate to process conditions. Non-limiting examples include process gas composition and flow rates, temperature, pressure, plasma conditions (such as RF bias power levels and exposure times), etc. These parameters may be provided to the user in the form of a recipe, which may be entered utilizing the user interface.

Signals for monitoring the process may be provided by analog and/or digital input connections of system controller 1050 from various process tool sensors. The signals for controlling the process may be output on the analog and digital output connections of process tool 1000. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 1050 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller will typically include one or more memory devices and one or more processors configured to execute the instructions so that the apparatus will perform a method in accordance with the present invention. Machine-readable, non-transitory media containing instructions for controlling process operations in accordance with the present invention may be coupled to the system controller.

The various hardware and method embodiments described above may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility.

Lithographic patterning of a film typically comprises some or all of the following steps, each step enabled with a number of possible tools: (1) application of photoresist on a workpiece, e.g., a substrate having a silicon nitride film formed thereon, using a spin-on or spray-on tool; (2) curing of photoresist using a hot plate or furnace or other suitable curing tool; (3) exposing the photoresist to visible or UV or x-ray light with a tool such as a wafer stepper; (4) developing the resist so as to selectively remove resist and thereby pattern it using a tool such as a wet bench or a spray developer; (5) transferring the resist pattern into an underlying film or workpiece by using a dry or plasma-assisted etching tool; and (6) removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above described processes may be changed.

The subject matter of the present disclosure includes all novel and nonobvious combinations and sub-combinations of the various processes, systems and configurations, and other features, functions, acts, and/or properties disclosed herein, as well as any and all equivalents thereof.

EXPERIMENTAL

Experimental results have shown that ALD-deposited $TiO_2$ is a promising material for use as an encapsulation layer in emerging memory fields such as MRAM and PCRAM. The titanium oxide shows excellent step coverage with no pattern loading (no etching profile differences between film deposited in isolated features and film deposited in dense features), good hermeticity, and good film stability at the relevant temperatures.

Figure 11:
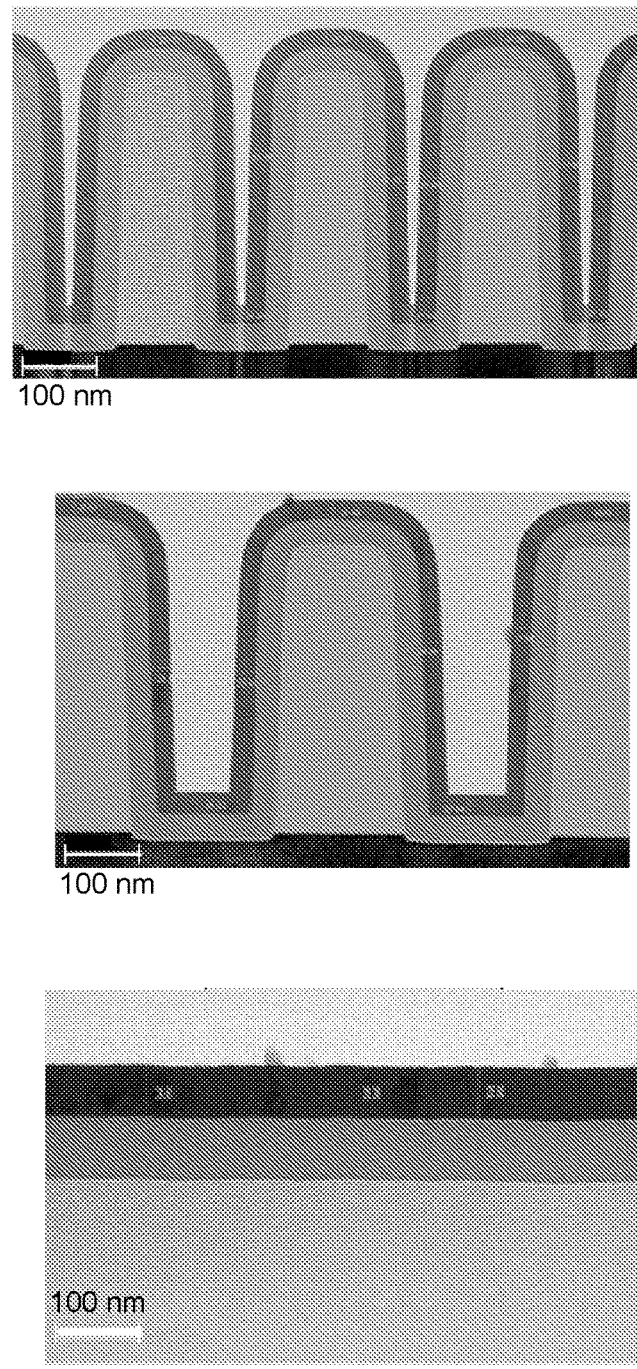
FIG. 11 shows a substrate that has a layer of titanium oxide deposited conformally thereon.

FIG. 11 shows SEM images of a substrate having a layer of $TiO_2$ deposited thereon. The substrate shown here is a test wafer having a base layer of silicon 1101. A layer of silicon oxide 1102 was deposited above the silicon 1101. The silicon oxide layer 1102 was etched to form recessed features. The features were first lined with nitride material 1103 deposited through a low pressure chemical vapor deposition (LPCVD) process. The $TiO_2$ was deposited on the nitride layer at a temperature of about 150° C. Though three separate panels are shown in FIG. 11, each of the panels shows a different part of the same substrate. In other words, the titanium oxide films in each panel were deposited at the same time through the same process on the same substrate. The top panel shows relatively high aspect ratio (AR) features that are packed relatively densely. The middle panel shows lower aspect ratio features that are packed less densely. The bottom panel shows a field region. In a typical deposition process during manufacture, a substrate may have a variety of features with different aspect ratios and different feature densities. One important goal during deposition is to deposit material uniformly on the substrate, both within a feature (for good step coverage), and between different features. Where a substrate includes both high aspect ratio dense features and low aspect ratio isolated features, it can be challenging to deposit in both types of features uniformly. As shown in FIG. 11, however, the ALD-deposited titanium oxide was deposited very uniformly in both types of features, as well as in the field region.

Figures 12, 13:
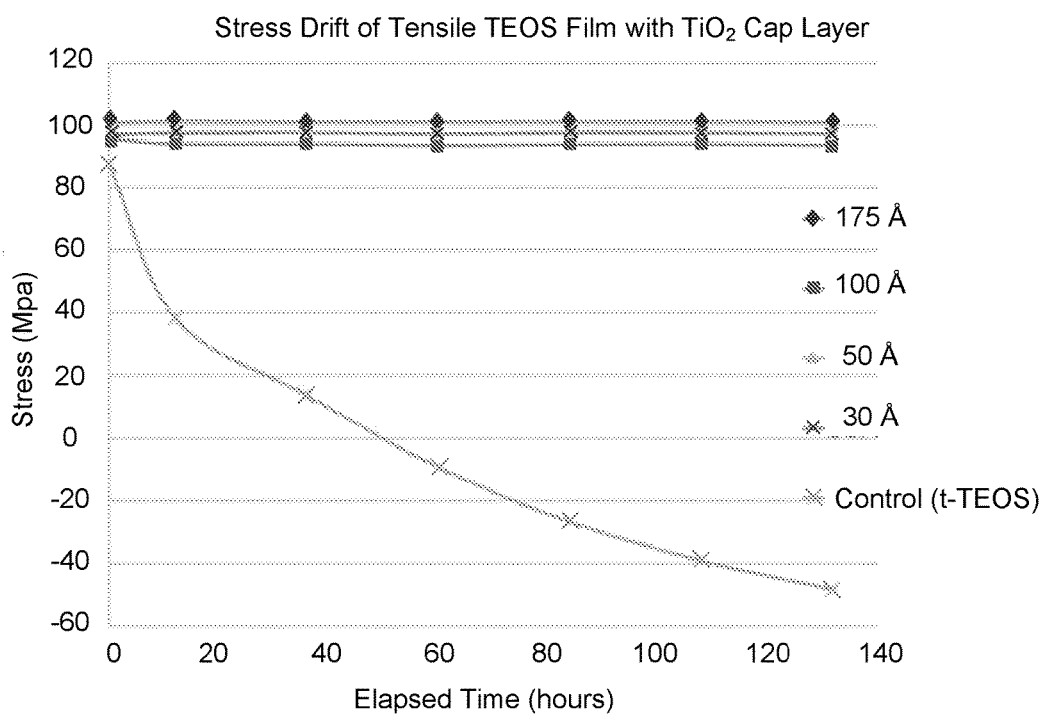
FIG. 12 is a table describing film thickness at different locations on the substrate shown in FIG. 11.
FIG. 13 is a graph depicting the stress drift of a tensile TEOS film, with and without titanium oxide encapsulation layers thereon.

FIG. 12 presents a table describing the film properties of the titanium oxide film of FIG. 11. The film thickness was measured at the top, sidewall and bottom portions of each feature. The step coverage is calculated by dividing the sidewall thickness by the top thickness (S/T), and is expressed in a percent. The High AR row of FIG. 12 corresponds to the high aspect ratio feature shown in the top panel of FIG. 11. The Low AR row of FIG. 12 corresponds to the lower aspect ratio feature shown in the middle panel of FIG. 11. The Field row of FIG. 12 corresponds to the field region shown in the bottom panel of FIG. 11. The film thickness was substantially uniform throughout the entire film. The high aspect ratio feature showed a step coverage of about 99.9%, and the low aspect ratio feature showed a step coverage of about 99.1%. Further, there was substantially no pattern loading. In other words, the film thickness was very uniform for all feature types. In certain embodiments, the step coverage of a titanium oxide film is between about 98-102%, for example between about 99-101%.

FIG. 13 is a graph showing the stress drift of different films deposited over a tensile TEOS-based silicon oxide film. The films were deposited with $N_2O$-only plasma at a temperature of about 150° C. RF power was about 2.5 kW, and pressure was about 3.5 Torr. As described above, when a bare tensile TEOS film is exposed to atmosphere, it begins to absorb moisture. The stress of the tensile TEOS film changes in a predictable manner as the moisture enters the film. This stress drift is shown by the Control (t-TEOS) line of FIG. 13. However, this stress drift does not occur (or occurs to a much lesser extent) where the tensile TEOS film has a sufficiently effective hermetic cap to prevent the absorption of moisture. Four different thicknesses of $TiO_2$ film were tested, including thicknesses between about 30-175 Å. All of the $TiO_2$ films proved to be sufficiently hermetic to prevent a stress drift in the tensile-TEOS film. This means that even at thicknesses down to about 30 Å, the $TiO_2$ provides a good hermetic seal to protect underlying layers. In the context of an encapsulation layer for capping memory stacks, this hermeticity is beneficial because moisture will be prevented from entering the memory stacks and oxidizing or otherwise degrading the stack materials.

Figure 14:
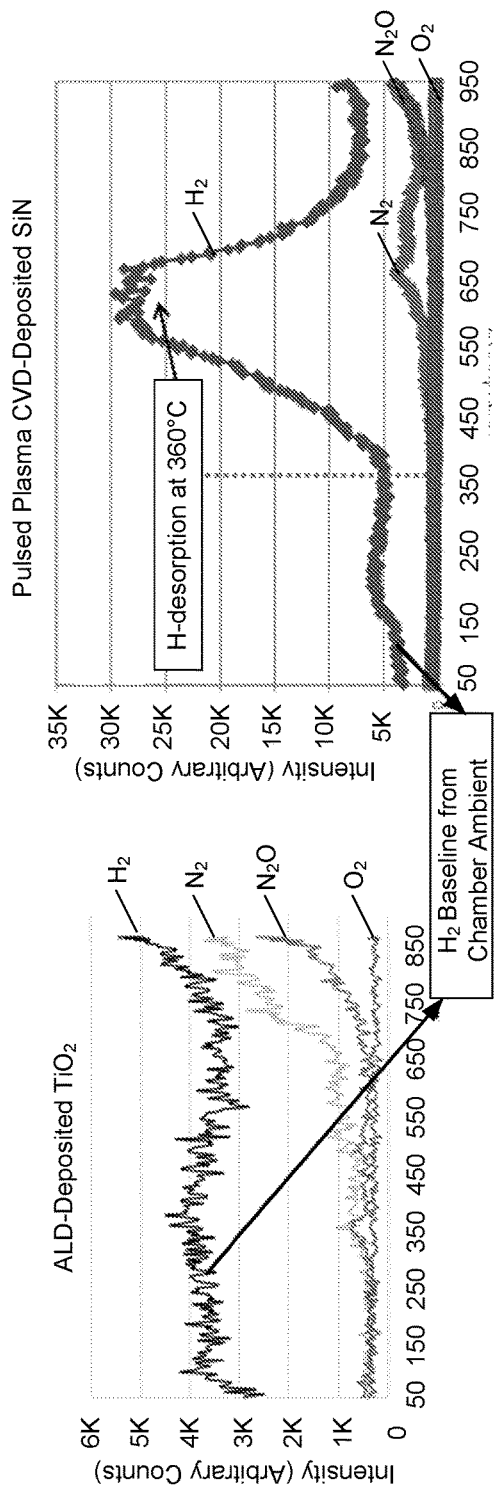
FIG. 14 presents two graphs illustrating film stability and gas desorption for a titanium oxide film and for a silicon nitride film.

FIG. 14 presents two graphs illustrating the stability of certain films at different temperatures. The films were formed using N2O-only plasma, an RF power of about 2.5 kW, at a pressure of about 3.5 Torr. The data were generated by thermal dispersive spectrometry (TDS). The left panel of FIG. 14 relates to a $TiO_2$ film deposited through an ALD process as described herein. The right panel of FIG. 14 relates to a SiN film deposited through a pulsed plasma CVD process. The right panel is provided for the sake of comparison. The ALD-deposited $TiO_2$ shows very good film stability up through at least about 500° C. Substantially no $H_2$, $N_2$, $O_2$ or $N_2O$ are being desorbed from the film up through this temperature. In contrast, the SiN film shows substantial desorption of $H_2$ starting around 360° C. While the TiO2 film shows some level of hydrogen even at low temperatures, this hydrogen level corresponds to the baseline level from the chamber ambient. This relatively low level of hydrogen was seen across many samples, and does not signify any change in the film being tested. This same baseline hydrogen level is seen at low temperatures in the SiN film, for example. These results suggest that titanium oxide deposited through ALD as described herein is stable at the relevant operating temperatures. In some embodiments, the encapsulation layer does not substantially desorb hydrogen at temperatures up to about 500° C. As used herein, "does not substantially desorb hydrogen" means that at the relevant temperatures, the level of hydrogen observed through TDS does not rise more than about 25% above the ambient level.

Figure 15:
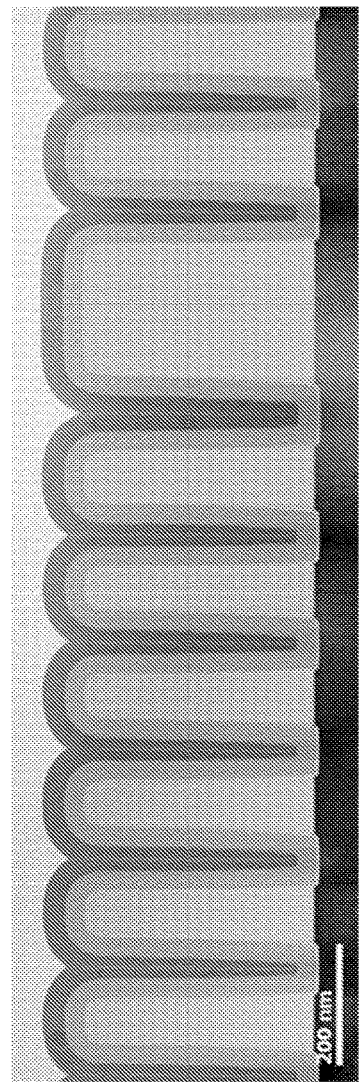
FIG. 15 shows a substrate that has a layer of titanium oxide lining and filling gaps between adjacent features.

FIG. 15 shows an example where TiO$_2$ was deposited through an ALD process in order to fill gaps between features. In this example, the TiO$_2$ both lines the features (like an encapsulation layer) and also fills the spaces between the features (like a gap filling material). The TiO2 deposited in a very conformal manner. The film is slightly thicker in the field region, but this extra thickness is present because the film continued to deposit conformally after the gaps were filled. The extra thickness in the field region does not represent an overburden as would be seen with CVD deposited films, for example. These results suggest that a titanium oxide encapsulation layer may be extended in thickness in order to fill the gaps between adjacent features/memory stacks. Although seams can be observed where two sidewalls meet, the seams are fairly small, and no voids are present in the filled gaps. This technique may be especially useful where the gaps to be filled have smaller aspect ratios, for example an aspect ratio of about 1:2.5 or less (depth:width). The presence of seams is a less serious problem in these small aspect ratio gaps as compared to larger aspect ratio gaps.

What is claimed is:

1. A method of depositing a titanium dioxide bilayer over a plurality of structures on a substrate, the method comprising:
    (a) receiving the substrate in a reaction chamber, the substrate being a semiconductor substrate and comprising the plurality of structures on a surface of the substrate;
    (b) flowing a first titanium-containing reactant into the reaction chamber and allowing the first titanium-containing reactant to adsorb onto the surface of the substrate;
    (c) flowing a first oxygen-containing reactant into the reaction chamber and allowing the first oxygen-containing reactant to adsorb onto the surface of the substrate;
    (d) exposing the reaction chamber to plasma for a duration of about 0.5 seconds or less to drive a surface reaction between the first titanium-containing reactant and the first oxygen-containing reactant to thereby conformally deposit a first titanium dioxide layer over the plurality of structures, wherein the plasma is generated using an RF power density of about 1750 W/m$^2$ or less;
    (e) repeating (b)-(d) until the first titanium dioxide layer reaches a final thickness;
    (f) after (e), flowing a second titanium-containing reactant into the reaction chamber and allowing the second titanium-containing reactant to adsorb onto the surface of the substrate;
    (g) flowing a second oxygen-containing reactant into the reaction chamber and allowing the second oxygen-containing reactant to adsorb onto the surface of the substrate;
    (h) exposing the reaction chamber to a second plasma to drive a second surface reaction between the second titanium-containing reactant and the second oxygen-containing reactant to thereby conformally deposit a second titanium dioxide layer over the first titanium dioxide layer, wherein the second titanium dioxide layer is deposited under different plasma conditions than the first titanium dioxide layer; and
    (i) repeating (f)-(h) until the second titanium dioxide layer reaches a second final thickness, wherein the first titanium dioxide layer and the second titanium dioxide layer together form the titanium dioxide bilayer.

2. The method of claim 1, wherein the first oxygen-containing reactant comprises a weak oxidant.

3. The method of claim 2, wherein the first oxygen-containing reactant does not include oxygen (O$_2$).

4. The method of claim 2, wherein during deposition of the first titanium dioxide layer, the first oxygen-containing reactant is substantially free of strong oxidants.

5. The method of claim 2, wherein during deposition of the second titanium dioxide layer, the second oxygen-containing reactant is selected from the group consisting of oxygen, nitrous oxide, carbon monoxide, carbon dioxide, nitric oxide, nitrogen dioxide, ozone, sulfur oxide, sulfur dioxide, oxygen-containing hydrocarbons, water, hydrogen peroxide, alkyl alcohols, and combinations of the foregoing.

6. The method of claim 1, wherein during (h), an RF power density used to generate the second plasma is maintained above about 7075 W/m$^2$, and wherein during each iteration of (h), the second plasma is exposed to the substrate for a duration of about 0.5 seconds or greater.

7. The method of claim 2, wherein during (h), an RF power density used to generate the second plasma is maintained above about 7075 W/m$^2$, and wherein during each iteration of (h), the second plasma is exposed to the substrate for a duration of about 0.5 seconds or greater.

8. The method of claim 1, wherein the final thickness of the first titanium dioxide layer is between about 20-500 Å.

9. The method of claim 1, wherein the first titanium dioxide layer hermetically seals the substrate after the first titanium dioxide layer is deposited in (d)-(e).

10. The method of claim 1, wherein the method is performed at a temperature between about 50-300° C.

11. The method of claim 1, wherein depositing the first titanium dioxide layer does not substantially or selectively oxidize any of the materials in the structures on the substrate.

12. The method of claim 1, wherein the first titanium dioxide layer does not substantially desorb hydrogen up to a temperature of at least about 500° C.

13. An apparatus for depositing a titanium dioxide bilayer on partially fabricated semiconductor substrates, comprising:
    a reaction chamber;
    an inlet to the reaction chamber for introducing gas phase reactants;
    an outlet to the reaction chamber for removing material from the reaction chamber;
    a plasma generator configured to expose the reaction chamber to plasma; and
    a controller configured to:
        receive a partially fabricated semiconductor substrate having a plurality of structures thereon in the reaction chamber;
        flow a first titanium-containing reactant into the reaction chamber and allow the first titanium-containing reactant to adsorb onto the surface of the partially fabricated semiconductor substrate;
        flow a first oxygen-containing reactant into the reaction chamber and allow the first oxygen-containing reactant to adsorb onto the surface of the partially fabricated semiconductor substrate;
        generate a first plasma with the plasma generator, and expose the reaction chamber to the first plasma for a duration of about 0.5 seconds or less to drive a surface reaction between the first titanium-containing reactant and the first oxygen-containing reactant to thereby conformally deposit a first titanium dioxide layer over the plurality of structures on the partially fabricated semiconductor substrate, wherein the first plasma is generated using an RF power density of about 1750 W/m² or less;

flow a second titanium-containing reactant into the reaction chamber and allow the second titanium-containing reactant to adsorb onto the surface of the partially fabricated semiconductor substrate;

flow an second oxygen-containing reactant into the reaction chamber and allow the second oxygen-containing reactant to adsorb onto the surface of the partially fabricated semiconductor substrate; and generate a second plasma with the plasma generator, and expose the reaction chamber to the second plasma to drive a surface reaction between the second titanium-containing reactant and the second oxygen-containing reactant to thereby conformally deposit a second titanium dioxide layer over the first titanium dioxide layer, wherein the first titanium dioxide layer is deposited under different conditions than the second titanium dioxide layer, and wherein the first titanium dioxide layer and the second titanium dioxide layer together form the titanium oxide bilayer.

14. The apparatus of claim 13, wherein the first oxygen-containing reactant comprises a weak oxidant, and wherein the second oxygen-containing reactant comprises $O_2$ and/or $N_2O$.

15. The apparatus of claim 13, wherein the controller is configured to generate the second plasma at an RF power density of about 7075 W/m² or more, and to expose the reaction chamber to the second plasma for a duration of about 0.5 seconds or more per plasma exposure.

16. A method of forming a titanium dioxide bilayer over a plurality of structures on a substrate, comprising:
(a) receiving the substrate in a reaction chamber, the substrate comprising the plurality of structures on a surface of the substrate;
(b) depositing a first titanium dioxide layer on the plurality of structures using a first plasma-assisted atomic layer deposition reaction;
(c) after (b), depositing a second titanium dioxide layer on the first titanium dioxide layer using a second plasma-assisted atomic layer deposition reaction, wherein the second plasma-assisted atomic layer deposition reaction is performed under different plasma conditions than the first plasma-assisted atomic layer deposition reaction, and wherein the first titanium dioxide layer and the second titanium dioxide layer together form the titanium dioxide bilayer.

17. The method of claim 16, wherein the first plasma-assisted atomic layer deposition reaction comprises exposing the substrate to a first plasma, wherein the first plasma is generated at an RF power density of about 1750 W/m² or less.

18. The method of claim 17, wherein the second plasma-assisted atomic layer deposition reaction comprises exposing the substrate to a second plasma, wherein the second plasma is generated at an RF power density of about 7075 W/m² or greater.

19. The method of claim 18, wherein the substrate is exposed to the first plasma for durations of about 0.5 seconds or less, and wherein the substrate is exposed to the second plasma for durations of about 0.5 seconds or more.

20. The method of claim 16, wherein the first titanium dioxide layer is deposited using a first set of reactants, wherein the second titanium dioxide layer is deposited using a second set of reactants, and wherein the first set of reactants differs from the second set of reactants.

* * * * *